United States Patent
Muramoto

(10) Patent No.: US 9,991,141 B2
(45) Date of Patent: Jun. 5, 2018

(54) SUBSTRATE PROCESSING APPARATUS AND HEATER CLEANING METHOD

(71) Applicant: DAINIPPON SCREEN MFG. CO., LTD., Kyoto (JP)

(72) Inventor: Ryo Muramoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 764 days.

(21) Appl. No.: 14/386,685

(22) PCT Filed: Feb. 25, 2013

(86) PCT No.: PCT/JP2013/054808
§ 371 (c)(1),
(2) Date: Sep. 19, 2014

(87) PCT Pub. No.: WO2013/140955
PCT Pub. Date: Sep. 26, 2013

(65) Prior Publication Data
US 2015/0047677 A1 Feb. 19, 2015

(30) Foreign Application Priority Data

Mar. 23, 2012 (JP) .................... 2012-068082
Mar. 23, 2012 (JP) .................... 2012-068083

(51) Int. Cl.
*H01L 21/67* (2006.01)
*B08B 3/02* (2006.01)
(Continued)

(52) U.S. Cl.
CPC ........ *H01L 21/67115* (2013.01); *B08B 3/024* (2013.01); *B08B 3/04* (2013.01);
(Continued)

(58) Field of Classification Search
CPC .................. B08B 3/024; B08B 3/04
See application file for complete search history.

(56) References Cited

U.S. PATENT DOCUMENTS 5,379,784 A   1/1995 Nishi et al. ............. 134/102.3
5,587,019 A  12/1996 Fujie ....................... 118/725
(Continued)

FOREIGN PATENT DOCUMENTS

CN   1460289 A   12/2003
CN   1985357 A   6/2007
(Continued)

OTHER PUBLICATIONS

PCT Notification Concerning Transmittal of International Preliminary Report on Patentability PCT/IB/326 and International Preliminary Report on Patentability PCT/IB/373 dated Oct. 2, 2014.
(Continued)

*Primary Examiner* — Mikhail Kornakov
*Assistant Examiner* — Natasha N Campbell
(74) *Attorney, Agent, or Firm* — Ostrolenk Faber LLP

(57) ABSTRACT

A substrate processing apparatus includes a heater having an infrared lamp and a housing for heating an upper surface of a substrate held by a substrate holding mechanism with the heater in opposed relation to the upper surface. A heater cleaning method includes locating the heater at a position above a lower nozzle in opposed relation to a first spout of the lower nozzle, the lower nozzle being in opposed relation to a lower surface of the substrate held by the substrate holding mechanism, and a lower cleaning liquid spouting step of supplying a cleaning liquid to the lower nozzle to spout the cleaning liquid upward from the first spout with no substrate being held by the substrate holding mechanism to thereby supply the cleaning liquid to an outer surface of the housing of the heater located at the heater cleaning position.

8 Claims, 15 Drawing Sheets

(51) Int. Cl.
  *B08B 3/04* (2006.01)
  *B08B 5/02* (2006.01)
  *H01L 21/311* (2006.01)

(52) U.S. Cl.
  CPC .......... *B08B 5/02* (2013.01); *H01L 21/67051* (2013.01); *H01L 21/31133* (2013.01)

(56) References Cited

U.S. PATENT DOCUMENTS

| | | | |
|---|---|---|---|
| 5,998,766 A | 12/1999 | Mizosaki et al. | 219/390 |
| 6,555,790 B1 | 4/2003 | Ono et al. | 219/390 |
| 6,559,064 B1 | 5/2003 | Shimizu | 438/745 |
| 2004/0050494 A1 | 3/2004 | Ohmi et al. | 156/345.41 |
| 2004/0137751 A1* | 7/2004 | Ou-Yang | B05C 11/08 438/720 |
| 2007/0275178 A1 | 11/2007 | Nishi et al. | 427/430.1 |
| 2012/0257181 A1 | 10/2012 | Funabashi et al. | 355/30 |

FOREIGN PATENT DOCUMENTS

| | | |
|---|---|---|
| JP | 5-243166 | 9/1993 |
| JP | 05-259097 | 10/1993 |
| JP | 08-031878 | 2/1996 |
| JP | 09-186127 A | 7/1997 |
| JP | 9-219356 A | 8/1997 |
| JP | 11-102884 | 4/1999 |
| JP | 2921781 B2 | 4/1999 |
| JP | 11-135469 | 5/1999 |
| JP | 2921781 | 7/1999 |
| JP | 11-283949 | 10/1999 |
| JP | 2000-279899 A | 10/2000 |
| JP | 2000-349006 A | 12/2000 |
| JP | 2001-156049 A | 6/2001 |
| JP | 2003-332287 | 11/2003 |
| JP | 2004-259734 | 9/2004 |
| JP | 2005-093926 | 4/2005 |
| JP | 2006-012881 | 1/2006 |
| JP | 2009-026948 | 2/2009 |
| JP | 2010-003845 A | 1/2010 |
| WO | WO 2011/074521 | 6/2011 |
| WO | WO 2011/074521 A1 | 6/2011 |

OTHER PUBLICATIONS

PCT Notification of Transmittal of Translation of the International Preliminary Report on Patentability PCT/IB/338 and English translation of International Preliminary Report on Patentability PCT/IB373 dated Oct. 2, 2014.

International Search Report dated May 21, 2013 in corresponding PCT International Application No. PCT/JP2013/054808.

Written Opinion dated May 21, 2013 in corresponding PCT International Application No. PCT/JP2013/054808.

* cited by examiner

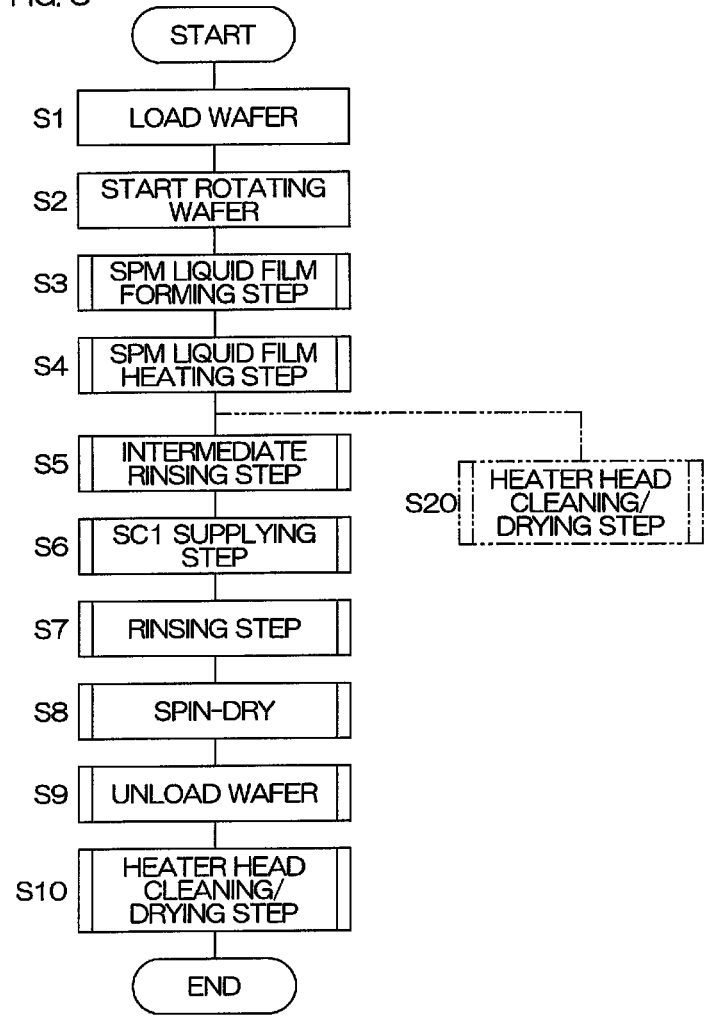

LIQUID PUDDLING SPEED

HEATING SPEED

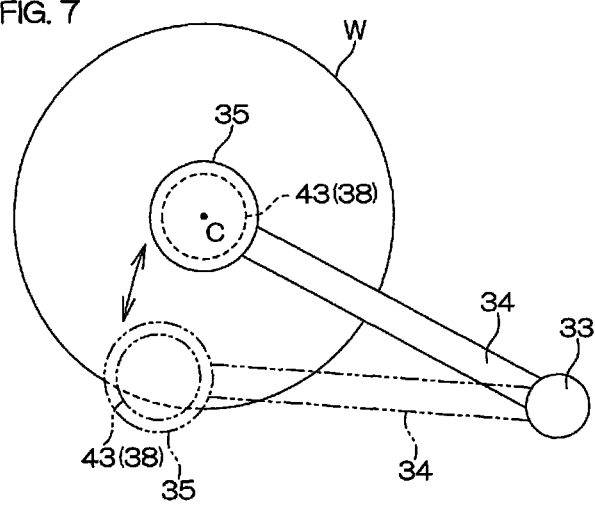

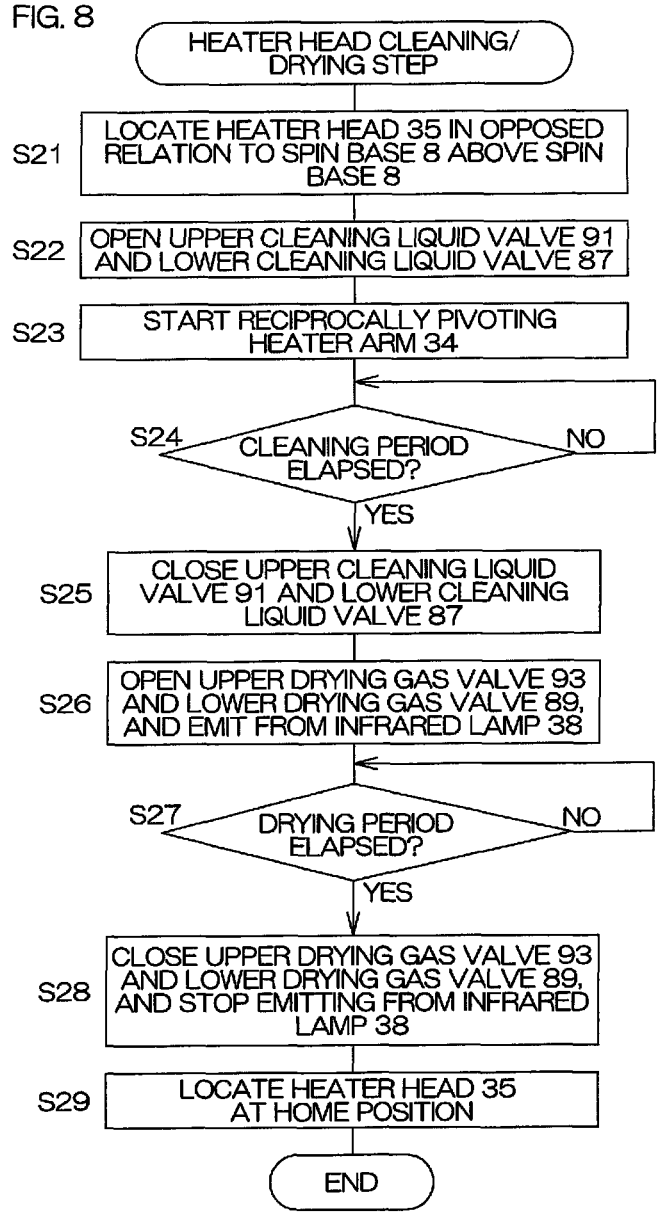

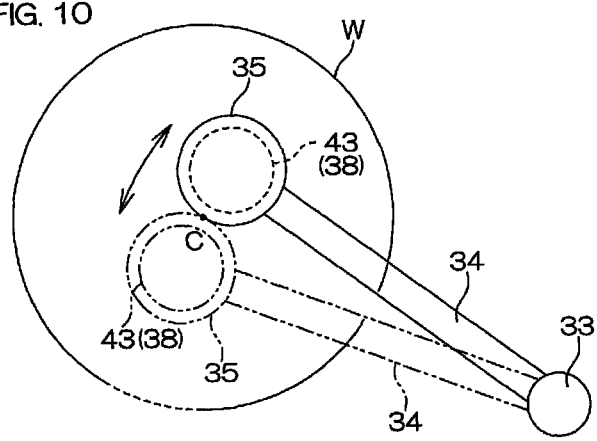

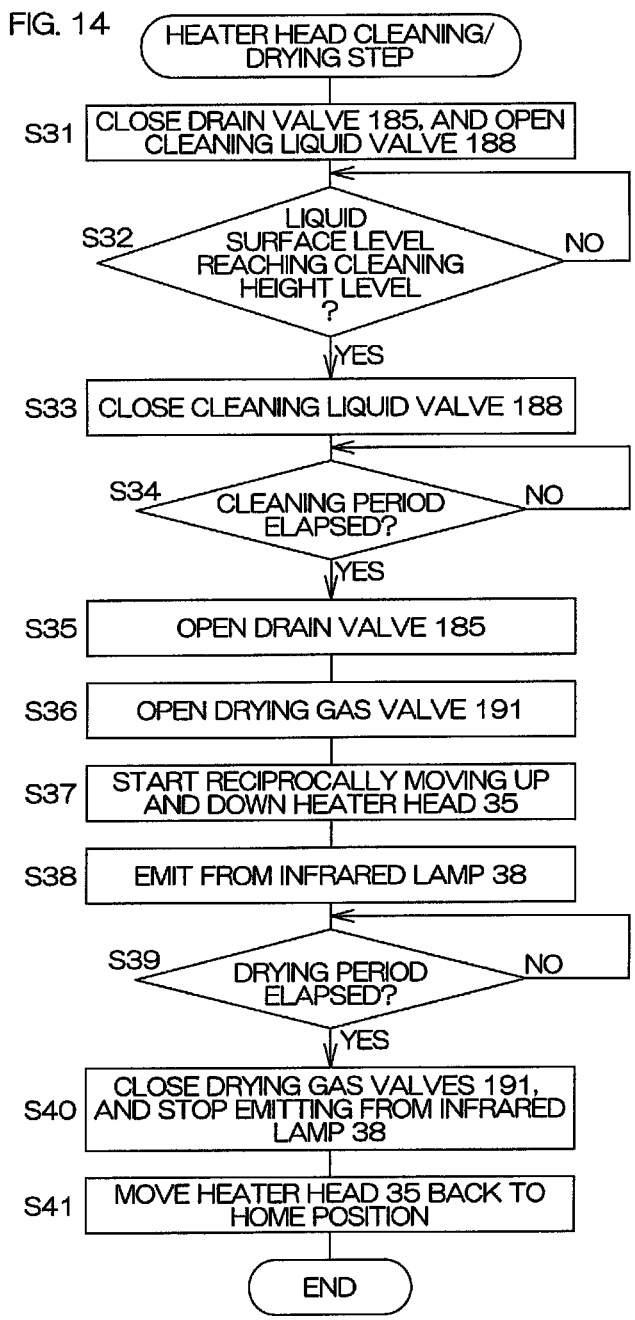

SUBSTRATE PROCESSING APPARATUS AND HEATER CLEANING METHOD

CROSS-REFERENCE TO RELATED APPLICATIONS

The present application is a 35 U.S.C. §§ 371 national phase conversion of PCT/JP2013/054808, filed Feb. 25, 2013, which claims priority to Japanese Application Nos. 2012-068082 and 2012-068083, both filed Mar. 23, 2012, the contents of all of which are incorporated herein by reference. The PCT International Application was published in the Japanese language.

TECHNICAL FIELD

The present invention relates to a substrate treatment apparatus including a heater having an infrared lamp for heat-treating a substrate, and a heater cleaning method for cleaning the heater. Examples of the substrate to be heat-treated include semiconductor wafers, glass substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

BACKGROUND ART

Semiconductor device production processes include the step of locally implanting an impurity (ions) such as phosphorus, arsenic or boron, for example, into a front surface (major surface) of a semiconductor wafer (hereinafter referred to simply as "wafer"). In order to prevent the ion implantation into an unnecessary portion of the wafer, a resist pattern of a photosensitive resin is formed on the front surface of the wafer to mask the unnecessary portion of the wafer with the resist in this step. After the ion implantation, the resist pattern formed on the front surface of the wafer becomes unnecessary. Therefore, a resist removing process is performed for removing the unnecessary resist from the front surface of the wafer after the ion implantation.

In a typical resist removing process, the front surface of the wafer is irradiated with oxygen plasma to ash the resist on the front surface of the wafer. Then, a chemical liquid such as a sulfuric acid/hydrogen peroxide mixture (SPM liquid) which is a liquid mixture of sulfuric acid and a hydrogen peroxide solution is supplied to the front surface of the wafer, whereby the ashed resist is removed. Thus, the removal of the resist from the front surface of the wafer is achieved.

However, the irradiation with the oxygen plasma for the ashing of the resist damages a portion of the front surface of the wafer uncovered with the resist (e.g., an oxide film exposed from the resist).

Therefore, a resist removing method such that the SPM liquid is supplied onto the front surface of the wafer to lift off the resist from the front surface of the wafer by the strong oxidative power of peroxosulfuric acid ($H_2SO_5$) contained in the SPM liquid without ashing the resist has recently been attracting attention.

CITATION LIST

Patent Literature

PTL1: JP2005-93926A

SUMMARY OF INVENTION

Technical Problem

The inventor of the present invention contemplates that a chemical liquid supplied onto a major surface of a substrate is heated to further increase the temperature of the chemical liquid on the major surface of the substrate during treatment with the chemical liquid. More specifically, the inventor contemplates that a heater having an infrared lamp and a housing accommodating the infrared lamp is located in opposed spaced relation to the major surface of the substrate to heat the chemical liquid present on the major surface of the substrate.

During the heating of the chemical liquid by the infrared lamp, however, the chemical liquid is steeply warmed to generate a great amount of chemical liquid mist around the major surface of the substrate. The chemical liquid mist generated during the heating adheres to a lower surface of the housing of the heater opposed to the major surface of the substrate. If the chemical liquid mist remains adhering to the lower surface of the housing, the intensity of infrared radiation outputted from the housing is reduced due to reduction in the infrared transmittance of the lower surface of the housing. In addition, the chemical liquid mist is dried to be crystallized, so that the lower surface of the housing is likely to be come a source of particles. Therefore, it is necessary to wash away the chemical liquid adhering to the lower surface of the heater housing each time a single substrate is treated.

A conceivable method for cleaning the heater housing is to provide a bar nozzle including a plurality of spouts horizontally arranged in a single row or in plural rows and each directed vertically downward, and supply a treatment liquid from the respective spouts to the heater from above. However, it is difficult to apply the cleaning liquid over the entire lower surface of the heater housing.

It is an object of the present invention to provide a substrate treatment apparatus and a heater cleaning method which ensure proper cleaning of a heater.

Solution to Problem

According to the present invention, there is provided a heater cleaning method for cleaning a heater which is arranged in opposed relation to an upper surface (upper major surface) of a substrate held by substrate holding means for heating the upper surface. The heater has an infrared lamp and a housing. The heater cleaning method includes: a heater locating step of locating the heater at a heater cleaning position above a lower nozzle such that the heater is opposed to a first spout of the lower nozzle, the lower nozzle being adapted to spout a liquid upward from the first spout in opposed relation to a lower surface of the substrate held by the substrate holding means; and a lower cleaning liquid spouting step of supplying a cleaning liquid to the lower nozzle to spout the cleaning liquid upward from the first spout with no substrate being held by the substrate holding means to thereby supply the cleaning liquid to an outer surface of the housing of the heater located at the heater cleaning position.

In this method, the heater is located at the heater cleaning position above the first spout, whereby the heater is opposed to the first spout. In this state, the cleaning liquid is spouted upward from the first spout. The cleaning liquid from the first spout gushes up to be applied to a lower portion of the outer surface of the housing of the heater located at the heater cleaning position to clean the lower outer surface portion.

The heater is used for heating the substrate held by the substrate holding means for heat treatment. In the heat treatment, the lower outer surface portion of the housing is opposed to the front surface of the substrate. After the heat treatment, therefore, foreign matter is likely to adhere to the lower outer surface portion of the housing. The foreign matter can be washed away with the cleaning liquid supplied upward, i.e., toward the lower outer surface portion of the housing, from the first spout. Thus, the outer surface of the housing can be advantageously cleaned. Therefore, the outer surface of the housing can be kept clean.

The housing may have an opposing surface which is opposed to the front surface of the substrate when the substrate is heat-treated by the infrared lamp. The heat treatment may be performed in a state such that a chemical liquid is present on the upper surface of the substrate. In this case, the chemical liquid is liable to be steeply warmed to generate a great amount of chemical liquid mist around the major surface of the substrate in the heat treatment. Then, the generated chemical liquid mist is liable to adhere to the opposing surface of the housing.

Even in this case, however, the opposing surface of the housing of the heater can be cleaned with the cleaning liquid to wash away the chemical liquid mist adhering to the opposing surface of the housing. Thus, the opposing surface of the housing can be kept clean. This prevents the reduction in the intensity of the infrared radiation outputted from the housing, and prevents the substrate treatment from being adversely influenced by particles occurring on the housing.

According to one embodiment of the present invention, the method further includes an upper cleaning liquid spouting step of spouting, concurrently with the lower cleaning liquid spouting step, the cleaning liquid downward from an upper nozzle disposed above the first spout (more specifically, above the heater cleaning position) to supply the cleaning liquid to the outer surface of the housing.

In this method, the cleaning liquid is spouted downward from the upper nozzle disposed above the heater located at the heater cleaning position, while the cleaning liquid is spouted from the lower nozzle. Therefore, the cleaning liquid can extensively spread over the outer surface of the housing. Thus, the outer surface of the housing of the heater can be extensively cleaned.

The upper nozzle may be a ceiling nozzle disposed on a ceiling wall of a treatment chamber in which the substrate holding means is accommodated.

According to another embodiment of the present invention, the method further includes a liquid applying position moving step of moving, concurrently with the lower cleaning liquid spouting step, a liquid applying position to which the cleaning liquid spouted from the first spout is applied on the outer surface of the housing.

In this method, the cleaning liquid applying position is moved on the outer surface of the housing, while the cleaning liquid is spouted from the first spout. Thus, the cleaning liquid can be extensively applied to the lower outer surface portion of the housing, thereby permitting effective cleaning.

The liquid applying position moving step may include the step of reciprocally moving the heater in a direction (horizontal direction) crossing a cleaning liquid spouting direction in which the cleaning liquid is spouted from the first spout.

According to further another embodiment of the present invention, the method further includes a drying step of removing the cleaning liquid from the outer surface of the housing after completion of the lower cleaning liquid supplying step.

In this method, the cleaning liquid remaining on the outer surface of the housing is removed after the heater housing is cleaned with the cleaning liquid. Thus, the substrate treatment is prevented from being adversely influenced by the cleaning liquid remaining on the outer surface of the housing.

According to still another embodiment of the present invention, the drying step includes a heat-drying step of irradiating the housing with infrared radiation emitted from the infrared lamp to heat the outer surface of the housing for drying the outer surface.

In this method, the housing is warmed by the irradiation with the infrared radiation emitted from the infrared lamp, whereby the cleaning liquid adhering to the outer surface of the housing evaporates to be removed. Thus, the outer surface of the housing can be advantageously dried.

According to further another embodiment of the present invention, the lower nozzle further has a second spout through which a gas is spouted upward, and the drying step includes a lower drying gas spraying step of supplying a drying gas to the lower nozzle to spray the drying gas upward from the second spout, whereby the drying gas is supplied to the outer surface of the housing of the heater located at the heater cleaning position.

In this method, the drying gas from the second spout is sprayed onto the lower outer surface portion of the housing of the heater. The cleaning liquid adhering to the lower outer surface portion of the housing is blown away by the drying gas. Thus, the outer surface of the housing can be advantageously dried.

According to the present invention, there is also provided a substrate treatment apparatus, which includes: a heater having an infrared lamp and a housing accommodating the infrared lamp, the heater being adapted to heat a major surface of a substrate at a treatment position at which the heater is opposed to the major surface of the substrate; and cleaning liquid supplying means which supplies a cleaning liquid to an outer surface of the housing with the heater being located at a cleaning position different from the treatment position.

With this arrangement, the heater is located at the cleaning position different from the treatment position employed for the heat treatment and, in this state, the cleaning liquid is supplied to the outer surface of the housing of the heater. Thus, foreign matter adhering to the outer surface of the housing can be washed away with the cleaning liquid. Therefore, the outer surface of the housing can be advantageously cleaned.

The housing may have an opposing surface which is opposed to the front surface of the substrate when the heat treatment is performed to heat the substrate by the infrared lamp. Further, the heat treatment may be performed on the substrate in a state such that a chemical liquid is present on the major surface of the substrate. In this case, the chemical liquid is liable to be steeply warmed by the infrared lamp to generate a great amount of chemical liquid mist around the major surface of the substrate in the heat treatment, and the chemical liquid mist is liable to adhere to the opposing surface of the housing.

However, the chemical liquid mist is washed away by supplying the cleaning liquid to the heater. Thus, the opposing surface of the housing can be cleaned. This prevents the reduction in the intensity of the infrared radiation outputted from the housing, and prevents the substrate treatment from being adversely influenced by particles occurring on the housing.

The cleaning position may be a stand-by position at which the heater is in stand-by and is retracted from the treatment position. With this arrangement, the cleaning operation is performed on the heater located at the stand-by position. Since the heater is located at the stand-by position, the heater can be cleaned irrespective of the progression status of the substrate treatment. That is, the heater can be cleaned without interrupting the substrate treatment, thereby increasing the productivity in the substrate treatment apparatus.

According to still another embodiment of the present invention, the substrate treatment apparatus further includes an accommodating member which accommodates the heater and receives cleaning liquid splashed from the heater. With this arrangement, the cleaning liquid is substantially prevented from scattering around the heater.

In this case, the accommodating member may include a bottomed storage container which has a drain port provided in its bottom and is capable of storing a liquid, and the cleaning liquid supplying means may include a cleaning liquid nozzle which supplies the cleaning liquid to the storage container. In this case, the substrate treatment apparatus may further include a drainage line which is connected to the drain port of the storage container for draining the liquid stored in the storage container, and a drain valve provided in the drainage line for opening and closing the drainage line.

With this arrangement, the draining of the cleaning liquid from the bottomed container is prevented by closing the drain valve. In this state, the cleaning liquid is supplied from the cleaning liquid nozzle to be stored in the storage container. The outer surface of the housing of the heater is immersed in the cleaning liquid stored in the storage container to be thereby cleaned.

The cleaning liquid supplying means may include a cleaning liquid nozzle having a cleaning liquid spout through which the cleaning liquid is spouted toward the outer surface of the housing.

According to further another embodiment of the present invention, the substrate treatment apparatus further includes drying gas spraying means which sprays a drying gas toward the outer surface of the housing for removing the cleaning liquid from the outer surface of the housing.

With this arrangement, the drying gas is sprayed from the drying gas spraying means to the housing of the heater. The cleaning liquid adhering to the outer surface of the housing is blown away by the drying gas. Thus, the outer surface of the housing can be advantageously dried.

According to still another embodiment of the present invention, the substrate treatment apparatus further includes heater up-and-down moving means which moves up and down the heater. The drying gas spraying means includes a drying gas nozzle which spouts the drying gas in a direction crossing a heater up-and-down moving direction. The substrate treatment apparatus further includes spray-drying controlling means which controls the drying gas spraying means and the heater up-and-down moving means to spout the drying gas from the drying gas nozzle and move up and down the heater to thereby move up and down a drying gas supply position to which the drying gas is supplied on the outer surface of the housing.

With this arrangement, the drying gas is spouted sideward from the drying gas nozzle, while the heater is moved up and down in opposed relation to a spout of the drying gas nozzle. Therefore, the drying gas is sprayed to a wider region of the outer surface (preferably, the entire outer surface) of the housing, so that the cleaning liquid can be removed from the wider region of the outer surface (preferably, the entire outer surface) of the housing. Thus, the outer surface of the housing can be advantageously dried.

According to further another embodiment of the present invention, the substrate treatment apparatus further includes heat-drying controlling means which irradiates the housing with infrared radiation emitted from the infrared lamp to heat the cleaning liquid adhering to the outer surface for drying the outer surface. With this arrangement, the housing is heated by the irradiation with the infrared radiation emitted from the infrared lamp, whereby the cleaning liquid adhering to the outer surface of the housing is removed. Thus, the outer surface of the housing can be advantageously dried.

According to the present invention, there is also provided a heater cleaning method for cleaning a heater which heats a major surface of a substrate at a treatment position at which the heater is opposed to the major surface of the substrate. The heater has an infrared lamp and a housing accommodating the infrared lamp. The heater cleaning method includes a heater locating step of locating the heater at a cleaning position different from the treatment position, and a cleaning liquid supplying step of supplying a cleaning liquid to an outer surface of the heater located at the cleaning position.

According to still another embodiment of the present invention, the method further includes a drying step of removing the cleaning liquid from the outer surface of the housing after completion of the cleaning liquid supplying step.

In this method, the cleaning liquid remaining on the outer surface of the housing is removed after the heater is cleaned by supplying the cleaning liquid. Thus, the substrate treatment is prevented from being adversely influenced by the cleaning liquid remaining on the outer surface of the housing.

According to further another embodiment of the present invention, the drying step includes a heat-drying step of irradiating the housing with infrared radiation emitted from the infrared lamp to heat the cleaning liquid on the outer surface for drying the outer surface.

According to still another embodiment of the present invention, the drying step includes a heater up-and-down moving step of moving up and down the heater, and a drying gas spouting step of spouting a drying gas from a drying gas nozzle toward the outer surface of the housing in a direction crossing a heater up-and-down moving direction.

The foregoing and other objects, features and effects of the present invention will become more apparent from the following description of embodiments with reference to the attached drawings.

BRIEF DESCRIPTION OF DRAWINGS

FIG. 5 is a process diagram showing an exemplary resist removing process to be performed by the substrate treatment apparatus.

FIG. 7 is a plan view showing a heater head moving range in the SPM liquid film heating step.

FIG. 8 is a flow chart showing an exemplary heater head cleaning/drying step.

FIG. 10 is a plan view showing a heater head moving range in the heater head cleaning/drying step.

FIG. 14 is a flow chart showing a process sequence of a heater head cleaning/drying step to be performed in the substrate treatment apparatus of FIG. 11.

DESCRIPTION OF EMBODIMENTS

Figure 1:
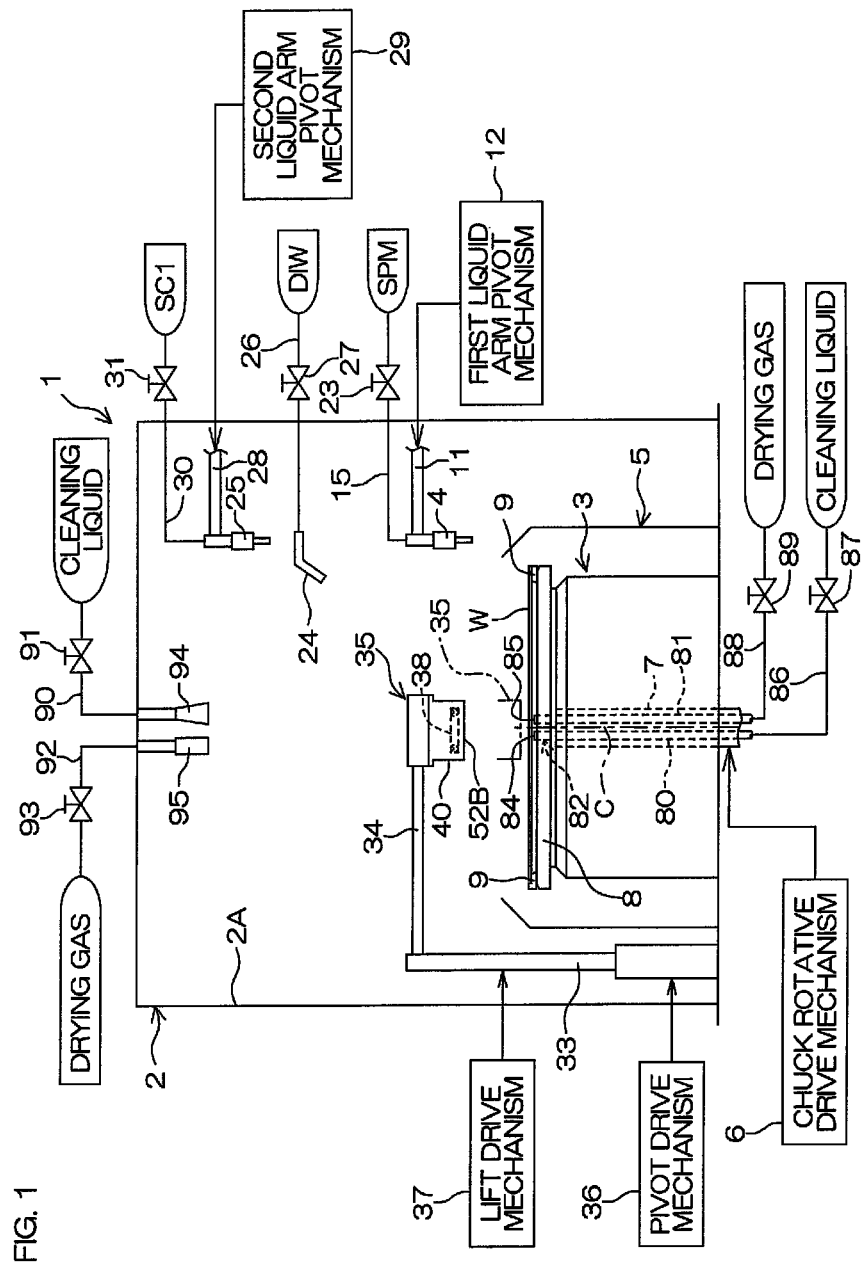
FIG. 1 is a diagram schematically showing the construction of a substrate treatment apparatus which performs a heater cleaning method according to one embodiment of the present invention.

FIG. 1 is a diagram schematically showing the construction of a substrate treatment apparatus 1 which performs a heater cleaning method according to one embodiment of the present invention. The substrate treatment apparatus 1 is an apparatus of a single substrate treatment type which is used for removing an unnecessary resist from a front surface (major surface) of a wafer W (exemplary substrate) after the front surface of the wafer W is subjected to an ion implantation process for an impurity implantation or subjected to a dry etching process.

The substrate treatment apparatus 1 includes a treatment chamber 2 defined by a partition wall 2A. A fan/filter unit (not shown) for supplying clean air into the treatment chamber 2 is provided in a ceiling wall of the treatment chamber 2. The clean air is air prepared by cleaning air in a clean room in which the substrate treatment apparatus 1 is provided.

The substrate treatment apparatus 1 includes a wafer rotating mechanism (substrate holding means) 3, a removal liquid nozzle (chemical liquid supplying means) 4 and a heater head (heater) 35 provided in the treatment chamber 2. The wafer rotating mechanism 3 holds and rotates a wafer W. The removal liquid nozzle 4 supplies an SPM liquid (chemical liquid) as an exemplary resist removal liquid to a front surface (upper surface) of the wafer W held by the wafer rotating mechanism 3. The heater head 35 is located in opposed relation to the front surface of the wafer W held by the wafer rotating mechanism 3 to heat the SPM liquid on the front surface of the wafer W.

The wafer rotating mechanism 3 may be, for example, of a clamping type. More specifically, the wafer rotating mechanism 3 includes, for example, a generally vertically extending spin shaft 7, a disk-shaped spin base 8 generally horizontally attached to an upper end of the spin shaft 7, and a plurality of clamping members 9 provided at positions generally equidistantly circumferentially of the spin base 8. The clamping members 9 clamp the wafer W in abutment against a peripheral surface of the wafer W, whereby the wafer W is generally horizontally held with its center located on a center axis of the spin shaft V.

A rotative force is inputted to the spin shaft 7 from a chuck rotative drive mechanism 6 including a motor (not shown). The rotative force thus inputted rotates the spin shaft 7, whereby the wafer W clamped by the clamping members 9 is generally horizontally held and rotated about a predetermined rotation axis (vertical axis) C together with the spin base 8. The chuck rotative drive mechanism 6 may be in the form of a hollow motor which includes a rotor (drive shaft) integral with the spin shaft 7 and a stator disposed around the rotor with the spin shaft 7 extending vertically therethrough (see FIG. 11).

The spin shaft 7 is a hollow shaft, and a back side liquid supply pipe 80 and a back side gas supply pipe 81 extending vertically are inserted in the spin shaft 7. An upper end of the back side liquid supply pipe 80 and an upper end of the back side gas supply pipe 81 are connected to a back side nozzle (lower nozzle) 82 provided at the upper end of the spin shaft 7. The back side nozzle 82 has a round backside liquid spout (first spout) 84 and a round back side gas spout (second spout) 85 provided at its upper end. The back side liquid spout 84 and the back side gas spout 85 are disposed in closely adjacent relation. The spouts 84, 85 are generally opposed to the rotation center of a lower surface of the wafer W held by the wafer rotating mechanism 3. The back side liquid spout 84 and the back side gas spout 85 are disposed at the same height level.

A lower cleaning liquid supply line 86 to which DIW (deionized water) is supplied as an exemplary cleaning liquid is connected to the back side liquid supply pipe 80. A lower cleaning liquid valve 87 for opening and closing the lower cleaning liquid supply line 86 is provided in the lower cleaning liquid supply line 86.

A lower drying gas supply line 88 to which nitrogen gas is supplied as an exemplary drying gas is connected to the back side gas supply pipe 81. A lower drying gas valve 89 for opening and closing the lower drying gas supply line 88 is provided in the lower drying gas supply line 88.

The removal liquid nozzle 4 is, for example, a straight nozzle which spouts the SPM liquid in the form of a continuous stream. The removal liquid nozzle 4 is attached to a distal end of a generally horizontally extending first liquid arm 11 with its spout directed downward. The first liquid arm 11 is pivotal about a predetermined vertical pivot axis. A first liquid arm pivot mechanism 12 for pivoting the first liquid arm 11 within a predetermined angular range is connected to the first liquid arm 11. By pivoting the first liquid arm 11, the removal liquid nozzle 4 is moved between a position on the rotation axis C of the wafer W (at which the removal liquid nozzle is opposed to the rotation center of the wafer W) and a home position defined on a lateral side of the wafer rotating mechanism 3. The home position is a stand-by position at which the heater head 35 is in stand-by after being retracted from above the wafer W.

A removal liquid supply line 15 to which the SPM liquid is supplied from an SPM supply source is connected to the removal liquid nozzle 4. A removal liquid valve 23 for switching on and off the supply of the SPM liquid from the removal liquid nozzle 4 is provided in the removal liquid supply line 15.

The substrate treatment apparatus 1 further includes a DIW nozzle 24, an SC1 nozzle 25 and a cup 5. The DIW nozzle 24 supplies DIW (deionized water) as a rinse liquid to the front surface of the wafer W held by the wafer rotating mechanism 3. The SC1 nozzle 25 supplies SC1 (an ammonia-hydrogen peroxide mixture) as a cleaning chemical liquid to the front surface of the wafer W held by the wafer rotating mechanism 3. The cup 5 surrounds the wafer rotating mechanism 3 to receive SPM liquid, SC1 and DIW flowing down or splashed from the wafer W.

The DIW nozzle 24 is, for example, a straight nozzle which spouts the DIW in the form of a continuous stream, and is fixedly disposed above the wafer rotating mechanism 3 with its spout directed toward around the rotation center of the wafer W. A DIW supply line 26 to which the DIW is supplied from a DIW supply source is connected to the DIW nozzle 24. A DIW valve 27 for switching on and off the supply of the DIW from the DIW nozzle 24 is provided in the DIW supply line 26.

The SC1 nozzle 25 is, for example, a straight nozzle which spouts the SC1 in the form of a continuous stream. The SC1 nozzle 25 is attached to a distal end of a generally horizontally extending second liquid arm 28 with its spout directed downward. The second liquid arm 28 is pivotal about a predetermined vertical pivot axis. A second liquid arm pivot mechanism 29 for pivoting the second liquid arm 28 within a predetermined angular range is connected to the second liquid arm 28. By pivoting the second liquid arm 28, the SC1 nozzle 25 is moved between a position on the rotation axis C of the wafer W (at which the SC1 nozzle is opposed to the rotation center of the wafer W) and a home position defined on the lateral side of the wafer rotating mechanism 3.

An SC1 supply line 30 to which the SC1 is supplied from an SC1 supply source is connected to the SC1 nozzle 25. An SC1 valve 31 for switching on and off the supply of the SC1 from the SC1 nozzle 25 is provided in the SC1 supply line 30.

A vertically extending support shaft 33 is disposed on a lateral side of the wafer rotating mechanism 3. A horizontally extending heater arm 34 is connected to an upper end of the support shaft 33. The heater head 35, in which an infrared lamp 38 is accommodated, is attached to a distal end of the heater arm 34. A pivot drive mechanism 36 which rotates the support shaft 33 about its center axis and a lift drive mechanism 37 which moves up and down the support shaft 33 along its center axis are connected to the support shaft 33.

A driving force is inputted to the support shaft 33 from the pivot drive mechanism 36 to rotate the support shaft 33 within a predetermined angular range, whereby the heater arm 34 is pivoted about the support shaft 33 above the wafer W held by the wafer rotating mechanism 3. By pivoting the heater arm 34, the heater head 35 is moved between a position on the rotation axis C of the wafer W (at which the heater head is opposed to the rotation center of the wafer W) and a home position defined on a lateral side of the wafer rotating mechanism 3. Further, a driving force is inputted to the support shaft 33 from the lift drive mechanism 37 to move up and down the support shaft 33, whereby the heater head 35 is moved up and down between a position adjacent to the front surface of the wafer W held by the wafer rotating mechanism 3 (a height position indicated by a two-dot-and-dash line in FIG. 1, and including a center adjacent position and an edge adjacent position to be described later) and a retracted position above the wafer W (a height position indicated by a solid line in FIG. 1). In this embodiment, the adjacent position is defined such that a distance between a lower surface (opposing surface) 52B of the heater head 35 and the front surface of the wafer W held by the wafer rotating mechanism 3 is, for example, 3 mm.

An upper cleaning liquid nozzle (ceiling nozzle) 94 and an upper drying gas nozzle (ceiling nozzle) 95 are provided in closely juxtaposed relation above the rotation axis C of the wafer rotating mechanism 3 on a lower surface of the ceiling wall of the treatment chamber 2.

The upper cleaning liquid nozzle 94 has a spout through which a liquid is spouted downward in a shower form. An upper cleaning liquid supply line 90 to which a cleaning liquid is supplied is connected to the upper cleaning liquid nozzle 94. An upper cleaning liquid valve 91 for opening and closing the upper cleaning liquid supply line 90 is provided in the upper cleaning liquid supply line 90.

The upper drying gas nozzle 95 has a spout through which a gas is spouted vertically downward. An upper drying gas supply line 92 to which nitrogen gas is supplied as an exemplary drying gas is connected to the upper drying gas nozzle 95. An upper drying gas valve 93 for opening and closing the upper drying gas supply line 92 is provided in the upper drying gas supply line 92.

Figure 2:
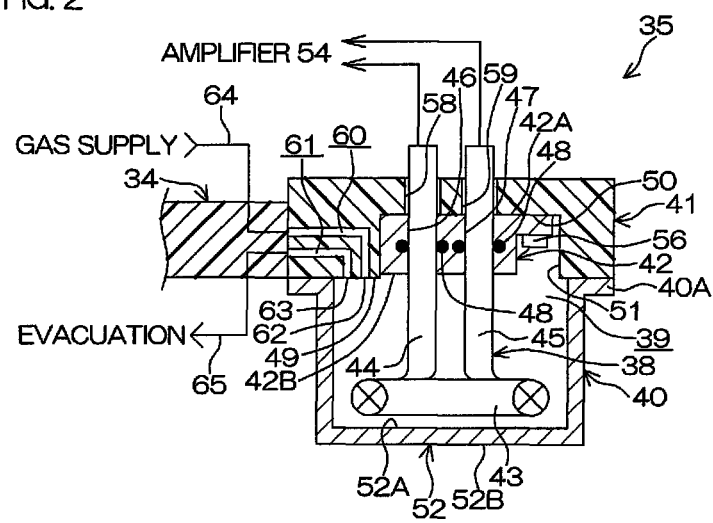
FIG. 2 is a schematic sectional view of a heater head provided in the substrate treatment apparatus.

FIG. 2 is a schematic sectional view showing the structure of the heater head 35.

The heater head 35 includes the infrared lamp 38, a lamp housing (housing) 40 which is a bottomed container having a top opening 39 and accommodating the infrared lamp 38, a support member 42 which supports the infrared lamp 38 while suspending the infrared lamp 38 in the lamp housing 40, and a lid (housing) 41 which closes the opening 39 of the lamp housing 40. In this embodiment, the lid 41 is fixed to the distal end of the heater arm 34.

Figure 3:
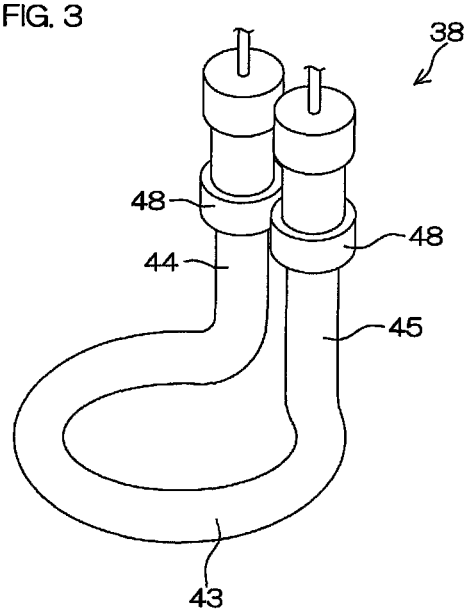
FIG. 3 is a perspective view of an infrared lamp provided in the heater head.

FIG. 3 is a perspective view showing an exemplary structure of the infrared lamp 38. As shown in FIGS. 2 and 3, the infrared lamp 38 is a unitary infrared lamp heater which includes an annular portion 43 having an annular (arcuate) shape, and a pair of straight portions 44, 45 extending vertically upward from opposite ends of the annular portion 43 along a center axis of the annular portion 43. The annular portion 43 mainly functions as a light emitting portion which emits infrared radiation. In this embodiment, the annular portion 43 has a diameter (outer diameter) of, for example, about 60 mm. With the infrared lamp 38 supported by the support member 42, the annular portion 43 assumes a horizontal attitude. In other words, the center axis of the annular portion 43 is an axis (vertical axis) perpendicular to the front surface of the wafer W held by the wafer rotating mechanism 3.

The infrared lamp 38 is configured such that a filament is accommodated in a quartz tube. An amplifier (see FIG. 4) for voltage supply is connected to the infrared lamp 38. Usable as the infrared lamp 38 are infrared heaters of shorter wavelength, intermediate wavelength and longer wavelength typified by halogen lamps and carbon lamps.

As shown in FIG. 2, the lid 41 has a disk shape, and is fixed to the heater arm 34 in a horizontal attitude. The lid 41 is formed of a fluororesin such as PTFE (polytetrafluoroethylene). In this embodiment, the lid 41 is formed integrally with the heater arm 34. However, the lid 41 may be formed separately from the heater arm 34. Exemplary materials for the lid 41 other than the resin material such as PTFE include ceramic materials and quartz.

The lid 41 has a generally cylindrical groove 51 formed in a lower surface 49 thereof. The groove 51 has a horizontal flat upper base surface 50, and an upper surface 42A of the support member 42 is fixed to the upper base surface 50 in contact with the upper base surface 50. The lid 41 has insertion holes 58, 59 extending in a vertical direction (vertically) through the upper base surface 50. Upper end portions of the straight portions 44, 45 of the infrared lamp 38 are respectively inserted in the insertion holes 58, 59.

The lamp housing 40 is a bottomed cylindrical container. The lamp housing 40 is formed of quartz.

The lamp housing 40 is fixed to the lower surface 49 of the lid 41 (in this embodiment, a portion of the lower surface not formed with the groove 51) with its opening 39 facing up. An annular flange 40A projects radially outward (horizontally) from a peripheral edge of the opening of the lamp housing 40. The flange 40A is fixed to the lower surface 49 of the lid 41 with a fixture unit such as bolts (not shown), whereby the lamp housing 40 is supported by the lid 41.

In this state, a bottom plate 52 of the lamp housing 40 has a horizontal disk shape. The bottom plate 52 has an upper surface 52A and a lower surface 52B (opposing surface) which are horizontal flat surfaces. In the lamp housing 40, a lower portion of the annular portion 43 of the infrared lamp 38 is located in closely opposed relation to the upper surface 52A of the bottom plate 52. The annular portion 43 and the bottom plate 52 are parallel to each other. In other words, the lower portion of the annular portion 43 is covered with the bottom plate 52 of the lamp housing 40. In this embodiment, the lamp housing 40 has an outer diameter of, for example, about 85 mm. Further, a vertical distance between the infrared lamp 38 (a lower portion of the annular portion 43) and the upper surface 52A is set to, for example, about 2 mm.

The support member 42 is a thick plate (having a generally disk shape), and is attached and fixed to the lid 41 from below in a horizontal attitude by bolts 56 or the like. The support member 42 is formed of a heat-resistant material (e.g., a ceramic or quartz). The support member 42 has two insertion holes 46, 47 extending in a vertical direction (vertically) through its upper surface 42A and lower surface 42B. The straight portions 44, 45 of the infrared lamp 38 are respectively inserted in the insertion holes 46, 47.

O-rings are respectively fixedly fitted around intermediate portions of the straight portions 44, 45. With the straight portions 44, 45 respectively inserted in the insertion holes 46, 47, outer peripheries of the O-rings 48 are kept in press contact with inner walls of the corresponding insertion holes 46, 47. Thus, the straight portions 44, 45 are prevented from being withdrawn from the respective insertion holes 46, 47, whereby the infrared lamp 38 is suspended to be supported by the support member 42.

When power is supplied to the infrared lamp 38 from the amplifier 54, the infrared lamp 38 emits infrared radiation. The infrared radiation is outputted through the lamp housing 40 downward of the heater head 35. The infrared radiation outputted through the bottom plate 52 of the lamp housing 40 heats the SPM liquid on the wafer W.

In a resist removing process to be described later, more specifically, the bottom plate 52 of the lamp housing 40 which defines the lower surface of the heater head 35 is located in opposed relation to the front surface of the wafer W held by the wafer rotating mechanism 3. In this state, the infrared radiation outputted through the bottom plate 52 of the lamp housing 40 heats the wafer W and the SPM liquid present on the wafer W.

The lid 41 is formed with a gas supply passage 60 through which air is supplied into the lamp housing 40, and an evacuation passage 61 through which an internal atmosphere of the lamp housing 40 is expelled. The gas supply passage 60 and the evacuation passage 61 respectively have a gas supply port 62 and an evacuation port 63 which are open in the lower surface of the lid 41. The gas supply passage 60 is connected to one end of a gas supply line 64. The other end of the gas supply line 64 is connected to an air supply source. The evacuation passage 61 is connected to one end of an evacuation line 65. The other end of the evacuation line 65 is connected to an evacuation source.

Figure 4:
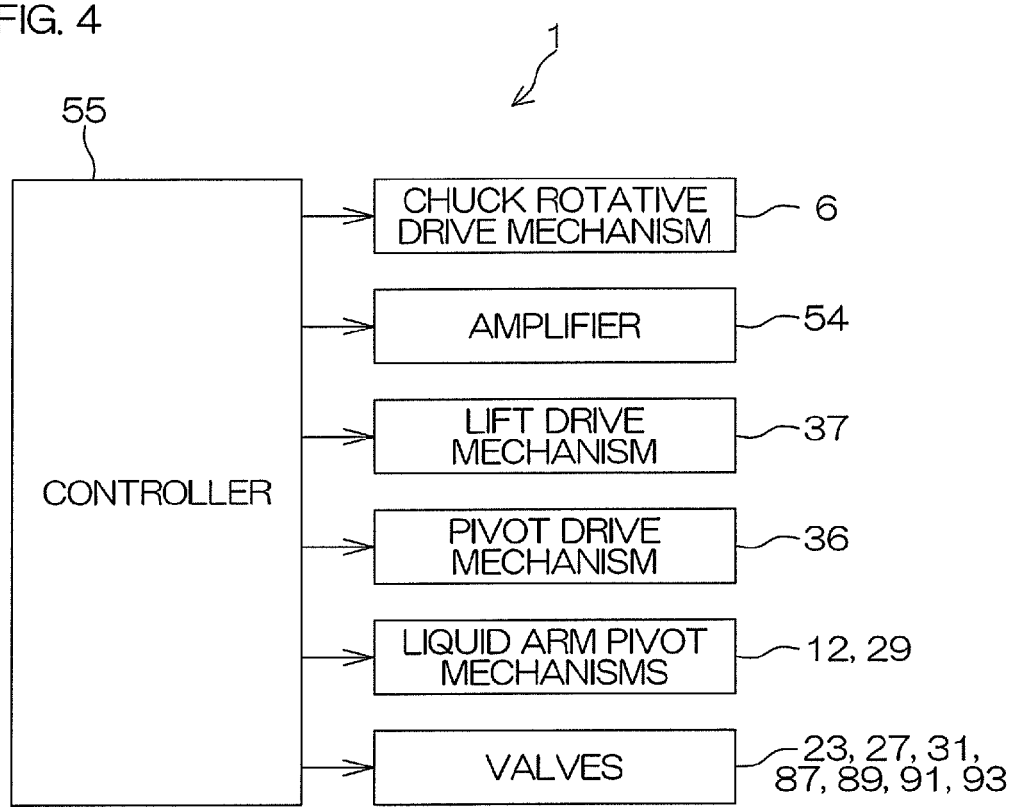
FIG. 4 is a block diagram showing the electrical construction of the substrate treatment apparatus shown in FIG. 1.

FIG. 4 is a block diagram showing the electrical construction of the substrate treatment apparatus 1. The substrate treatment apparatus 1 includes a controller 55 including a micro computer. The controller 55 is connected to the chuck rotative drive mechanism 6, the amplifier 54, the pivot drive mechanism 36, the lift drive mechanism 37, the first liquid arm pivot mechanism 12, the second liquid arm pivot mechanism 29, the removal liquid valve 23, the DIW valve 27, the SC1 valve 31, the lower cleaning liquid valve 87, the lower drying gas valve 89, the upper cleaning liquid valve 91, the upper drying gas valve 93 and the like, which are controlled by the controller 55.

Figure 6A:
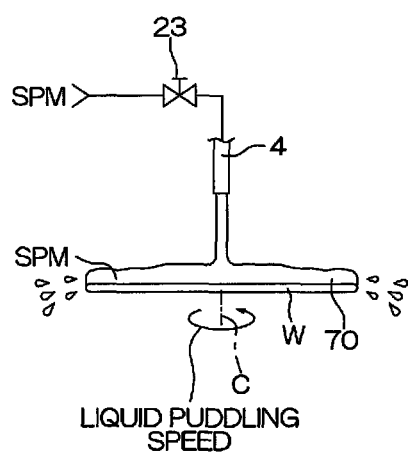
FIG. 6A is a schematic diagram for explaining an SPM liquid film forming step.
Figure 6B:
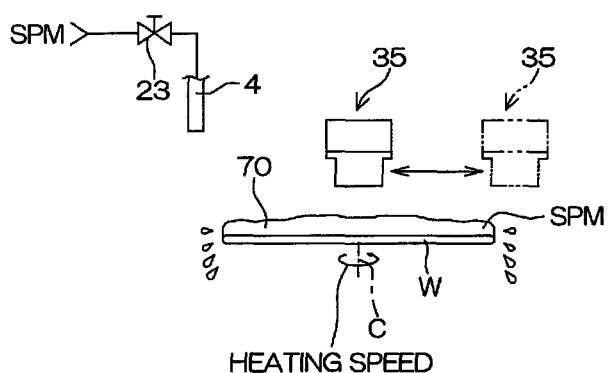
FIG. 6B is a schematic diagram for explaining an SPM liquid film heating step.

FIG. 5 is a process diagram showing an exemplary resist removing process to be performed by the substrate treatment apparatus 1. FIG. 6A is a schematic diagram for explaining an SPM liquid film forming step to be described later. FIG. 6B is a schematic diagram for explaining an SPM liquid film heating step to be described later. FIG. 7 is a plan view showing a movement range of the heater head 35 in the SPM liquid film heating step to be described later.

Referring to FIGS. 1 to 7, the exemplary resist removing process will hereinafter be described.

In the resist removing process, a wafer W having been subjected to an ion implantation process is loaded into the treatment chamber 2 (see FIG. 1) by a transport robot (not shown) controlled by the controller 55 (Step S1: Wafer loading step). The wafer W is transferred to the wafer rotating mechanism 3 with its front surface facing up. At this time, the heater head 35, the removal liquid nozzle 4 and the SC1 nozzle 25 are located at their home positions so as not to prevent the loading of the wafer W.

With the wafer W held by the wafer rotating mechanism 3, the controller 55 controls the chuck rotative drive mechanism 6 to start rotating the wafer W (Step S2). The rotation speed of the wafer W is increased to a liquid puddling speed (in a range of 30 to 300 rpm, e.g., 60 rpm), and then maintained at the liquid puddling speed. The liquid puddling speed is such that the wafer W can be covered with the SPM liquid to be thereafter supplied thereto, i.e., a liquid film of the SPM liquid can be retained on the front surface of the wafer W. Further, the controller 55 controls the first liquid arm pivot mechanism 12 to move the removal liquid nozzle 4 to above the wafer W.

After the rotation speed of the wafer W reaches the liquid puddling speed, the controller 55 opens the removal liquid valve 23 to supply the SPM liquid to the front surface of the wafer W from the removal liquid nozzle 4 as shown in FIG.

6A. The SPM liquid supplied to the front surface of the wafer W is retained on the front surface of the wafer W, whereby an SPM liquid film 70 is formed on the front surface of the wafer W as covering the entire surface (Step S3: SPM liquid film forming step).

At the start of the SPM liquid film forming step, as shown in FIG. 6A, the controller 55 controls the first liquid arm pivot mechanism 12 to locate the removal liquid nozzle 4 above the rotation center of the wafer W, and spouts the SPM liquid from the removal liquid nozzle 4. In this manner, the SPM liquid film 70 is formed on the front surface of the wafer W, whereby the SPM liquid spreads over the entire front surface of the wafer W. Thus, the entire front surface of the wafer W can be covered with the SPM liquid film 70.

After a lapse of a predetermined liquid film forming period from the start of the spouting of the SPM liquid from the removal liquid nozzle 4, the controller 55 controls the chuck rotative drive mechanism 6 to reduce the rotation speed of the wafer W to a predetermined heat treatment speed that is lower than the liquid puddling speed. Then, the SPM liquid film heating step (heat treatment) of Step S4 is performed.

The heat treatment speed is such that the SPM liquid film 70 can be retained on the front surface of the wafer W without the supply of the SPM liquid to the wafer W (in a range of 1 to 20 rpm, e.g., 15 rpm). In synchronism with the deceleration of the wafer W by the chuck rotative drive mechanism 6, as shown in FIG. 6B, the controller 55 closes the removal liquid valve 23 to stop supplying the SPM liquid from the removal liquid nozzle 4, and controls the first liquid arm pivot mechanism 12 to move the removal liquid nozzle 4 back to its home position. Although the supply of the SPM liquid to the wafer W is stopped, the SPM liquid film 70 is continuously retained on the front surface of the wafer W by reducing the rotation speed of the wafer W to the heat treatment speed.

As shown in FIGS. 6B and 7, the controller 55 controls the amplifier 54 to emit the infrared radiation from the infrared lamp 38. Further, the controller 55 controls the pivot drive mechanism 36 and the lift drive mechanism 37 to move the heater head 35 from its home position and further reciprocally move the heater head 35 between the center adjacent position (indicated by solid lines in FIGS. 6B and 7) at which the heater head is opposed to the rotation center of the wafer W and the edge adjacent position (indicated by two-dot-and-dash lines in FIGS. 6B and 7) at which the heater head is opposed to the peripheral edge of the wafer W. Portions of the wafer W and the SPM liquid present under the infrared lamp 38 are steeply warmed by the infrared radiation emitted from the infrared lamp 38, whereby the SPM liquid is warmed around an interface between the wafer W and the SPM liquid. Then, a portion of the front surface of the wafer W opposed to the lower surface 52B of the bottom plate 52 (opposed to the infrared lamp 38) is reciprocally moved along an arcuate path within a range extending from a region including the rotation center of the wafer W to a region including the peripheral edge of the wafer W. Thus, the entire front surface of the wafer W can be heated.

The portion of the SPM liquid under the infrared lamp 38 is steeply warmed by the infrared radiation emitted from the infrared lamp 38. Therefore, a great amount of mist of the SPM liquid is generated around the front surface of the wafer W.

The edge adjacent position is such that the lower surface 52B of the bottom plate 52, more preferably, the annular portion 43 of the infrared lamp 38, projects radially outward from the outer periphery of the wafer W when the heater head 35 is seen from above.

In the SPM liquid film heating step of Step S4, the SPM liquid film 70 is warmed around the interface between the front surface of the wafer W and the SPM liquid. During this period, a reaction between the SPM liquid and the resist on the front surface of the wafer W proceeds, whereby the resist is removed from the front surface of the wafer W.

After a lapse of a predetermined liquid film heating period from the reduction of the rotation speed of the wafer W, the controller 55 controls the amplifier 54 to stop emitting the infrared radiation from the infrared lamp 38. Further, the controller 55 controls the pivot drive mechanism 36 and the lift drive mechanism 37 to move the heater head 35 back to its home position. After completion of the SPM liquid film heating step, a great amount of the SPM liquid mist adheres to the lower surface 52B of the lamp housing 40 of the heater head 35.

The controller 55 controls the chuck rotative drive mechanism 6 to increase the rotation speed of the wafer W to a predetermined liquid treatment rotation speed (in a range of 300 to 1500 rpm, e.g., 1000 rpm). Further, the controller 55 opens the DIW valve 27 to supply the DIW from the spout of the DIW nozzle 24 toward around the rotation center of the wafer W (Step S5: Intermediate rinsing step). The DIW supplied to the front surface of the wafer W receives a centrifugal force generated by the rotation of the wafer W to flow toward the peripheral edge of the wafer W on the front surface of the wafer W. Thus, SPM liquid adhering to the front surface of the wafer W is rinsed away with the DIW.

After a lapse of a predetermined intermediate rinsing period from the start of the supply of the DIW, the DIW valve 27 is closed to stop supplying the DIW to the front surface of the wafer W.

While maintaining the rotation speed of the wafer W at the liquid treatment rotation speed, the controller 55 opens the SC1 valve 31 to supply the SC1 from the SC1 nozzle 25 to the front surface of the wafer W (Step S6). The controller 55 controls the second liquid arm pivot mechanism 29 to pivot the second liquid arm 28 within the predetermined angular range to reciprocally move the SC1 nozzle 25 between a position above the rotation center of the wafer W and a position above the peripheral edge of the wafer W. Thus, an SC1 supply position to which the SC1 is supplied from the SC1 nozzle 25 on the front surface of the wafer W is reciprocally moved along an arcuate path crossing the wafer rotating direction in a range from the rotation center of the wafer W to the peripheral edge of the wafer W. Thus, the SC1 uniformly spreads over the entire front surface of the wafer W, whereby foreign matter such as resist residue and particles adhering to the front surface of the wafer W can be removed by the chemical power of the SC1.

After the supply of the SC1 is continued for a predetermined SC1 supply period, the controller 55 closes the SC1 valve 31, and controls the second liquid arm pivot mechanism 29 to move the SC1 nozzle 25 back to its home position. While maintaining the rotation speed of the wafer W at the liquid treatment rotation speed, the controller 55 opens the DIW valve 27 to supply the DIW from the spout of the DIW nozzle 24 toward around the rotation center of the wafer W (Step S7: Rinsing step). The DIW supplied to the front surface of the wafer W receives a centrifugal force generated by the rotation of the wafer W to flow toward the peripheral edge of the wafer W on the front surface of the wafer W, whereby SC1 adhering to the front surface of the wafer W is rinsed away with the DIW.

After the supply of the DIW is continued for a predetermined rinsing period, the DIW valve 27 is closed to stop supplying the DIW to the front surface of the wafer W.

After a lapse of a predetermined period from the start of the rinsing step, the controller 55 closes the DIW valve 27 to stop supplying the DIW to the front surface of the wafer W. Thereafter, the controller 55 controls the chuck rotative drive mechanism 6 to increase the rotation speed of the wafer W to a predetermined higher rotation speed (e.g., 1500 to 2500 rpm), whereby a spin drying operation is performed to spin off the DIW from the wafer W to dry the wafer W (Step S8).

After the spin drying operation is performed for a predetermined spin drying period, the controller 55 controls the chuck rotative drive mechanism 6 to stop rotating the wafer rotating mechanism 3. Thus, the resist removing process is completed for the single wafer W, and the treated wafer W is unloaded from the treatment chamber 2 by the transport robot (Step S9).

After the unloading of the wafer W, a heater head cleaning/drying step is performed to clean and then dry the heater head 35 (Step S10). In the heater head cleaning/drying step, a cleaning operation is performed to clean the heater head 35, and a drying operation is performed on the cleaned heater head 35. Upon completion of the heater head cleaning/drying step of Step S10, the process sequence for the resist removing process is completed for the single wafer W.

Figure 9A:
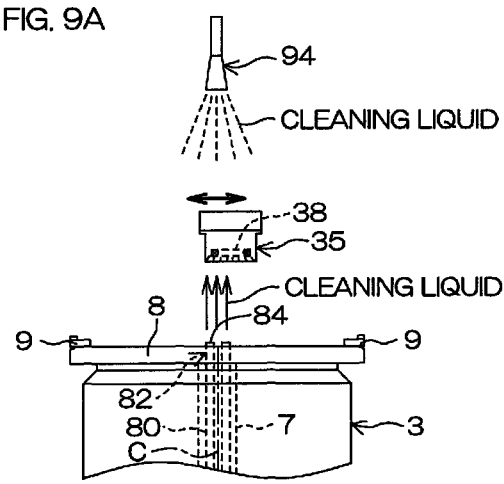
FIG. 9A is a schematic diagram for explaining a step of the heater head cleaning/drying step.
Figure 9B:
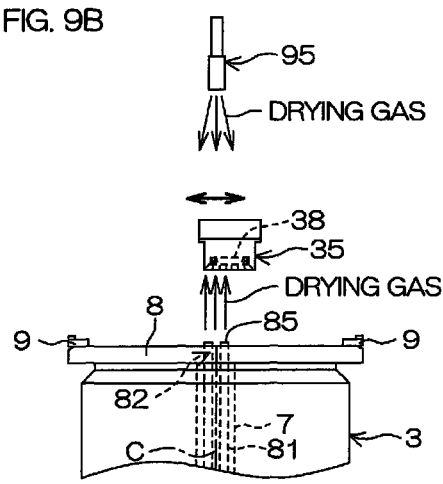
FIG. 9B is a schematic diagram showing a step subsequent to the step of FIG. 9A.

FIG. 8 is a flow chart for explaining an example of the heater head cleaning/drying step. FIG. 9A is a schematic diagram for explaining the cleaning operation of the heater head cleaning/drying step. FIG. 9B is a schematic diagram for explaining the drying operation of the heater head cleaning/drying step. FIG. 10 is a plan view showing a moving range of the heater head 35 in the heater head cleaning/drying step.

In the cleaning operation of the heater head cleaning/drying step, the controller 55 controls the pivot drive mechanism 36 to pivot the heater arm 34, and controls the lift drive mechanism 37 to move up or down the heater head 35 from its home position to a heater cleaning position defined above the wafer rotating mechanism 3. At this time, no wafer W is held by the wafer rotating mechanism 3. Therefore, the heater head 35 is located in opposed relation to the upper surface of the spin base 8 (Step S21: Heater locating step). More specifically, the round lower surface 52B of the heater head 35 (lamp housing 40) is located at the heater cleaning position above the rotation center (on the rotation axis C) of the wafer rotating mechanism 3. The heater cleaning position is desirably a height position such that the cleaning liquid gushing up from the back side liquid spout 84 reaches the lower surface 52B of the heater head 35.

As shown in FIG. 9A, the controller 55 opens the upper cleaning liquid valve 91 (see FIG. 1 and the like) to spout the cleaning liquid downward from the upper cleaning liquid nozzle 94 in a shower form (Step S22: Upper cleaning liquid spouting step). Thus, the cleaning liquid flowing down from the upper cleaning liquid nozzle 94 falls over the heater head 35 located at the heater cleaning position. That is, the cleaning liquid is applied to an upper surface of the heater head (e.g., an upper surface of the lid 41).

Further, the controller 55 opens the lower cleaning liquid valve 87 (see FIG. 1 and the like) to spout the cleaning liquid vertically upward from the back side liquid spout 84 of the back side nozzle 82 (Step S22: Lower cleaning liquid spouting step). Thus, the cleaning liquid gushes vertically upward from the backside liquid spout 84. The cleaning liquid gushing up from the back side liquid spout 84 is applied to the lower surface 52B of the bottom plate 52 of the lamp housing 40 which defines the lower surface of the heater head 35.

Further, the controller 55 controls the pivot drive mechanism 36 to pivot the heater arm 34 to reciprocally move the heater head 35 between a first movement end position and a second movement end position. Any position in a range between the first movement end position and the second movement end position is the heater cleaning position. The first movement end position is defined between the center of the spin base 8 and one of opposite peripheral positions of the spin base 8 above the spin base 8 as indicated by a solid line in FIG. 10. The second movement end position is defined between the center of the spin base 8 and the other peripheral position of the spin base 8 above the spin base 8 as indicated by a two-dot- and dash line in FIG. 10. More specifically, the first movement end position is such that one of opposite peripheral positions of the lower surface 52B of the lamp housing 40 is located above the rotation center of the spin base (on the rotation axis C). The second movement end position is such that the other peripheral position of the lower surface 52B of the heater head 35 (a peripheral position opposite from the one peripheral position with respect to the center of the lower surface 52B) is located above the rotation center of the spin base 8 (on the rotation axis C).

The controller 55 first controls the pivot drive mechanism 36 to pivot the heater arm 34, whereby the heater head 35 is moved from the center of the spin base 8 to the first movement end position (indicated by the solid line in FIG. 10). Then, the controller 55 controls the pivot drive mechanism 36 to pivot the heater arm 34 within the predetermined angular range to reciprocally move the heater head 35 between the first movement end position and the second movement end position (indicated by the two-dot-and-dash line in FIG. 10) (Step S23: Liquid applying position moving step).

Thus, a cleaning liquid applying position to which the cleaning liquid from the back side liquid spout 84 is applied on the lower surface 52B is reciprocally moved along an arcuate path crossing the circumference of the lower surface 52B within a range extending from the one peripheral position to the other peripheral position through the center of the lower surface 52B. Thus, the cleaning liquid is uniformly supplied to the entire lower surface 52B of the lamp housing 40, whereby foreign matter such as the SPM liquid mist is washed away from the lower surface 52B of the lamp housing 40 with the cleaning liquid.

A cleaning liquid applying position to which the cleaning liquid from the upper cleaning liquid nozzle 94 is applied on the upper surface of the heater head 35 (the upper surface of the lid 41) is reciprocally moved along an arcuate path. The cleaning liquid supplied to the upper surface of the heater head 35 spreads over the entire upper surface of the heater head 35 and further spreads to a side wall of the heater head 35.

Thus, the cleaning liquid uniformly spreads over the entire outer surface of the heater head 35, whereby the entire outer surface of the heater head 35 can be advantageously cleaned.

The spouting of the cleaning liquid from the upper cleaning liquid nozzle 94 and the backside liquid spout 84 and the reciprocal pivoting of the heater arm 34 are continued for a predetermined cleaning period.

Upon completion of the predetermined cleaning period (YES in STEP S24), the controller 55 closes the upper cleaning liquid valve 91 and the lower cleaning liquid valve 87 (Step S25) to stop spouting the cleaning liquid from the upper cleaning liquid nozzle 94 and the back side liquid spout 84.

As shown in FIG. 9B, the controller 55 opens the upper drying gas valve 93 (Step S26). Thus, the drying gas from the upper drying gas nozzle 95 is sprayed to the upper surface of the heating head 35 located at the heater cleaning position. The cleaning liquid adhering to the upper surface of the heater head 35 is blown away by the drying gas.

Further, the controller 55 opens the lower drying gas valve 89 (Step S26: Lower drying gas spraying step). Thus, the drying gas from the back side gas spout 85 of the back side nozzle 82 is sprayed to the lower surface 52B of the lamp housing 40 of the heater head 35 located at the heater cleaning position.

At this time, the controller 55 controls the pivot drive mechanism 36 to pivot the heater arm 34 to reciprocally move the heater head 35 between the first movement end position and the second movement end position. Thus, a spraying position to which the drying gas is sprayed from the back side gas spout 85 on the lower surface 52B is reciprocally moved along the arcuate path crossing the circumference of the lower surface 52B within the range extending from the one peripheral position to the other peripheral position through the center of the lower surface 52B.

Thus, the drying gas is uniformly supplied to the entire lower surface 52B of the lamp housing 40, whereby the cleaning liquid adhering to the lower surface 52B of the lamp housing 40 is blown away by the drying gas.

Further, the controller 55 controls the amplifier 54 to emit infrared radiation from the infrared lamp 38 (Step S26: Heat-drying step). Thus, the lamp housing 40 is warmed, whereby the cleaning liquid adhering to the lower surface 52B and the outer periphery of the lamp housing 40 evaporates to be removed.

The spouting of the drying gas from the upper drying gas nozzle 95 and the back side nozzle 82 and the emission of the infrared radiation from the infrared lamp 38 are continued for a predetermined drying period.

Upon completion of the predetermined drying period (YES in Step S27), the controller 55 closes the upper drying gas valve 93 and the lower drying gas valve 89 (Step S28) to stop spouting the drying gas from the upper drying gas nozzle 95 and the back side gas spout 85.

Further, the controller 55 controls the pivot drive mechanism 36 to pivot the heater arm 34 to move the cleaned heater head 35 back to its home position.

Upon completion of the heater head cleaning/drying step, the process sequence for the resist removing process ends.

According to this embodiment, as described above, the cleaning operation for cleaning the heater head 35 is performed in the resist removing process for each wafer W. In this cleaning operation, the heater head 35 is located at the heater cleaning position in opposed relation to the back side liquid spout 84 above the back side liquid spout 84. The cleaning liquid is spouted vertically upward from the back side liquid spout 84. The cleaning liquid from the back side liquid spout 84 gushes vertically upward to be applied to the lower surface 52B of the lamp housing 40 of the heater head 35 located at the heater cleaning position.

A great amount of the SPM liquid mist generated in the SPM liquid film heating step is liable to adhere to the lower surface 52B of the lamp housing 40. Since the SPM liquid mist adhering to the lower surface 52B of the lamp housing 40 can be washed away with the cleaning liquid supplied from the back side liquid spout 84 to the lower surface 52B of the lamp housing 40, the lower surface 52B of the lamp housing 40 can be advantageously cleaned. Thus, the lower surface 52B of the lamp housing 40 can be kept clean. As a result, it is possible to prevent the reduction in the intensity of the infrared radiation outputted from the lamp housing 40, while preventing the lower surface 52B of the housing 40 from becoming the source of particles.

After the cleaning of the heater head 35, the outer surface of the heater head 35 is dried. This prevents the cleaning liquid remaining on the outer surface of the heater head 35 from adversely influencing the treatment of the wafer W.

The embodiment described above may be modified as mentioned in the followings.

In the embodiment described above, the cleaning liquid is supplied to the heater head 35 from both of the upper cleaning liquid nozzle 94 and the back side liquid spout 84 in the cleaning of the heater head 35 by way of example. Alternatively, the heater head 35 may be cleaned by supplying the cleaning liquid to the heater head 35 only from the back side liquid spout 84 without supplying the cleaning liquid from the upper cleaning liquid nozzle 94 in the heater head cleaning operation. In this case, the spraying of the drying gas from the upper drying gas nozzle 95 to the heater head 35 is not necessary in the heater head drying operation.

In the embodiment described above, the cleaning liquid applying position on the lower surface 52B of the heater head 35 is moved by horizontally reciprocally moving the heater head 35. However, a nozzle having a spout adapted to spout a liquid in a variable liquid spouting direction, for example, may be employed as the back side nozzle 82 instead of the arrangement of moving the heater head 35. In this case, the cleaning liquid applying position on the lower surface 52B of the heater head 35 can be moved by changing the cleaning liquid spouting direction in which the cleaning liquid is spouted from the spout.

In the embodiment described above, a spray-drying operation in which the cleaning liquid adhering to the heater head 35 is blown away by spraying the drying gas from the upper drying gas nozzle 95 and the back side nozzle 82, and a heat-drying operation in which the lamp housing 40 is warmed by the infrared lamp 38 are both performed in the heater head drying operation by way of example. However, the heater head 35 may be dried by performing only the heat-drying operation with the use of the infrared lamp 38 without performing the spray-drying operation with the use of the drying gas.

The back side nozzle 82 has the back side liquid spout 84 and the back side gas spout 85. Instead of this nozzle, a nozzle configured such that the cleaning liquid and the drying gas are selectively spouted from a single spout may be employed.

The heater arm 34 may be cleaned in the heater head cleaning/drying step (Step S10 shown in FIG. 5). The cleaning liquid spouted from the upper cleaning liquid nozzle 94 may be used for the cleaning of the heater arm 34. Alternatively, a bar nozzle (not shown) separately provided in the treatment chamber 2 may be used for the cleaning of the heater arm 34. The bar nozzle includes a multiplicity of spouts horizontally arranged in a single row or in plural rows and each directed vertically downward, and is disposed, for example, in an upper region of the treatment chamber 2. In this case, the cleaning liquid is spouted from the respective spouts of the bar nozzle with the heater arm 34 (and the heater head 35) being located below the bar nozzle in opposed relation to the bar nozzle. Thus, the cleaning liquid falls over an outer surface of the heater arm 34 to clean the outer surface of the heater arm 34.

Further, the interior of the treatment chamber 2 may be cleaned (a chamber cleaning operation may be performed) in the heater head cleaning/drying step (Step S10 shown in FIG. 5).

Figure 11:
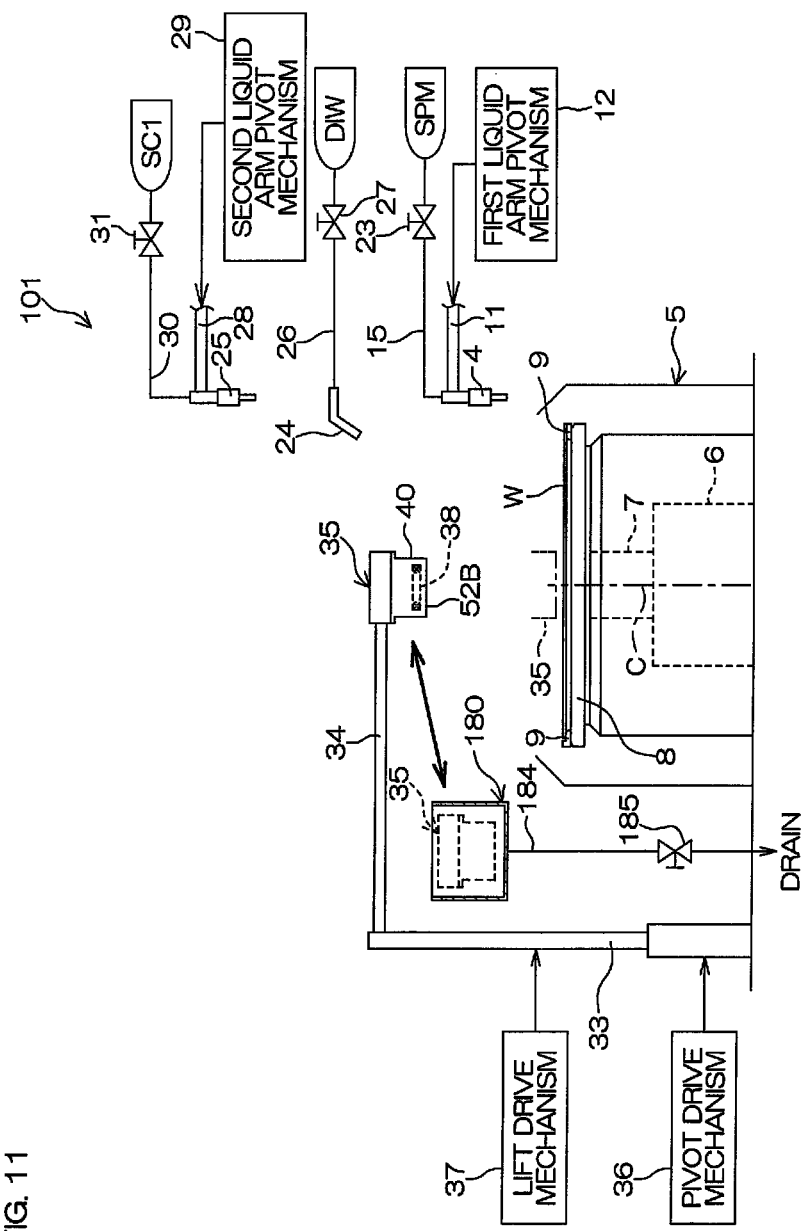
FIG. 11 is a diagram schematically showing the construction of a substrate treatment apparatus according to another embodiment of the present invention.

FIG. 11 is a diagram schematically showing the construction of a substrate treatment apparatus 101 according to another embodiment of the present invention. In FIG. 11, components corresponding to those shown in FIG. 1 are designated by the same reference characters as in FIG. 1, and duplicate description will be omitted.

A wafer rotating mechanism (substrate holding means) 3 which holds and rotates a wafer W, a removal liquid nozzle (chemical liquid supplying means) 4 which supplies an SPM liquid (exemplary resist removal liquid) as a chemical liquid to a front surface (upper surface) of the wafer W held by the wafer rotating mechanism 3, a heater head (heater) 35 which is located in opposed relation to the front surface of the wafer W held by the wafer rotating mechanism 3 to heat the SPM liquid on the front surface of the wafer W, and a cleaning pod (storage container) 180 are provided in a treatment chamber 2 of the substrate treatment apparatus 101.

The cleaning pod 180 is disposed at the home position of the heater head 35. The cleaning pod 180 is a bottomed cylindrical container. The heater head 35 is accommodated in stand-by in the cleaning pod 180 when it is not used.

Figure 12:
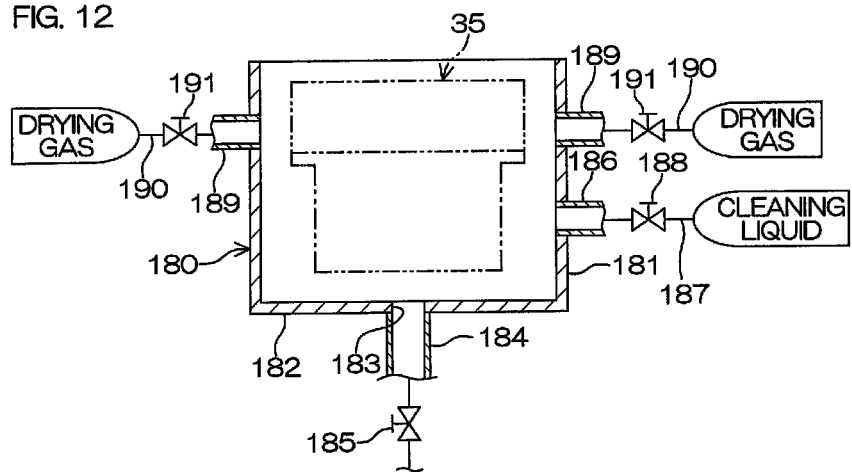
FIG. 12 is a diagram showing the structure of a cleaning pod provided in the substrate treatment apparatus shown in FIG. 11.

FIG. 12 is a diagram showing the structure of the cleaning pod 180. The cleaning pod 180 is a bottomed cylindrical container. The cleaning pod 180 has an open top, which defines an inlet for receiving the heater head 35. The heater head 35 is accommodated in the cleaning pod 180 through the inlet. The cleaning pod 180 includes a cylindrical peripheral wall 181 and a bottom 182 connected to a lower edge of the peripheral wall 181.

A drain port 183 is provided in a generally center portion of the bottom 182. A drainage line 184 is connected at one end thereof to the drain port 183 on the lower surface of the bottom 182. The other end of the drainage line 184 is connected to a drainage equipment for treatment of drained liquid. A drain valve 185 for opening and closing the drainage line 184 is provided in the drainage line 184. The drain valve 185 is usually open.

A cleaning liquid nozzle (cleaning liquid supplying means) 186 for supplying DIW as an exemplary cleaning liquid to the outer surface of the heater head 35 is provided on the peripheral wall 181. The cleaning liquid is supplied to the cleaning liquid nozzle 186 through a cleaning liquid supply line (cleaning liquid supplying means) 187. A cleaning liquid valve (cleaning liquid supplying means) 188 is provided in the cleaning liquid supply line 187. With the cleaning liquid valve 188 open, the cleaning liquid is supplied to the cleaning liquid nozzle 186 to be spouted from the spout of the cleaning liquid nozzle 186.

When the cleaning liquid is spouted from the cleaning liquid nozzle 186 with the drain valve 185 being closed, the cleaning liquid flows to the bottom 182 to be retained in the cleaning pod 180. With the drain valve 185 open, the cleaning liquid retained in the cleaning pod 180 is drained from the drain port 183 through the drainage line 184.

A drying gas nozzle (drying gas spraying means) 189 for supplying nitrogen gas as an exemplary drying gas to the outer surface of the heater head 35 is provided on the peripheral wall 181 at a position a little lower than an upper edge of the peripheral wall 181. In this embodiment, the drying gas nozzle 189 includes a plurality of drying gas nozzles 189 (e.g., a pair of drying gas nozzles 189). The pair of drying gas nozzles 189 respectively have spouts which are, for example, disposed on the peripheral wall 181 at the same height level in opposed relation to each other with respect to a center axis of the cleaning pod 180.

The drying gas is supplied to the respective drying gas nozzles 189 through drying gas supply lines (drying gas spraying means) 190. Drying gas valves (drying gas spraying means) 191 are respectively provided in the drying gas supply lines 190. With the drying gas valves 191 open, the drying gas is supplied to the corresponding drying gas nozzles 189. The drying gas is spouted generally horizontally from the drying gas nozzles 189 inward of the cleaning pod 180.

Figure 13:
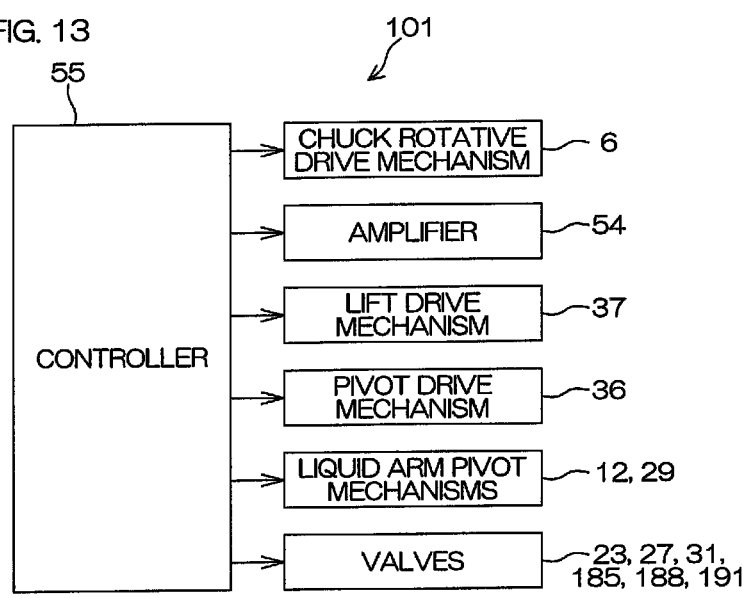
FIG. 13 is a block diagram showing the electrical construction of the substrate treatment apparatus shown in FIG. 11.

FIG. 13 is a block diagram showing the electrical construction of the substrate treatment apparatus 101. In FIG. 13, components corresponding to those shown in FIG. 4 are designated by the same reference characters as in FIG. 4. The substrate treatment apparatus 101 includes a controller 55 including a micro computer. The controller 55 is connected to the chuck rotative drive mechanism 6, the amplifier 54, the pivot drive mechanism 36, the lift drive mechanism 37, the first liquid arm pivot mechanism 12, the second liquid arm pivot mechanism 29, the removal liquid valve 23, the DIW valve 27, the SC1 valve 31, the drain valve 185, the cleaning liquid valve 188, the drying gas valves 191 and the like, which are controlled by the controller 55.

An exemplary resist removing process to be performed by the substrate treatment apparatus 101 is substantially the same as in the preceding embodiment. That is, the substrate treatment apparatus 101 can also perform the resist removing process described with reference to FIGS. 5, 6A, 6B and 7. However, the heater head cleaning/drying step (Step S10 in FIG. 5) is performed in a different manner and, therefore, will be described below.

When the heater head 35 is located at its home position, the heater head 35 is accommodated in the cleaning pod 180. That is, the controller 55 drives the pivot drive mechanism 36 to move the heater arm 34 so that the heater head 35 is located vertically above the top of the cleaning pod 180. Further, the controller 55 controls the lift drive mechanism 37 to move the heater arm 34 and the heater head 35 vertically downward until the heater head 35 reaches its home position. Upon reaching the home position, the heater head 35 is in stand-by at that position. At the home position, at least the lamp housing 40 of the heater head 35 is entirely accommodated (preferably, the heater head 35 is entirely accommodated) in the cleaning pod 180.

In this embodiment, the heater head 35 is not cleaned above the spin base 8 but at the home position. Therefore, the heater head 35 can be cleaned even without the wafer W unloaded, i.e., even with the wafer W present on the spin base 8, as long as the heater head 35 is not used. That is, the heater head 35 can be cleaned irrespective of the progression status of the resist removing process. Therefore, the heater head 35 can be cleaned at any time in the non-use period. More specifically, the cleaning operation and the drying operation (Step S20: Heater head cleaning/drying step indicated by a two-dot-and-dash line in FIG. 5) may be performed on the heater head 35 returned to the home position after the completion of the SPM liquid film heating step (Step S4 shown in FIG. 5). The heater head cleaning/drying step may be performed at any time after the SPM liquid film heating step.

Figure 15A:
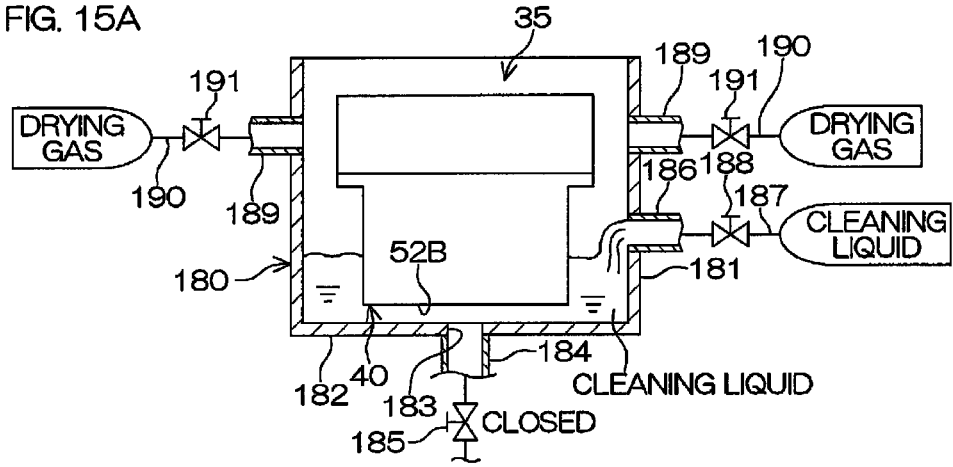
FIG. 15A is a schematic diagram for explaining a step of the heater head cleaning/drying step.
Figure 15B:
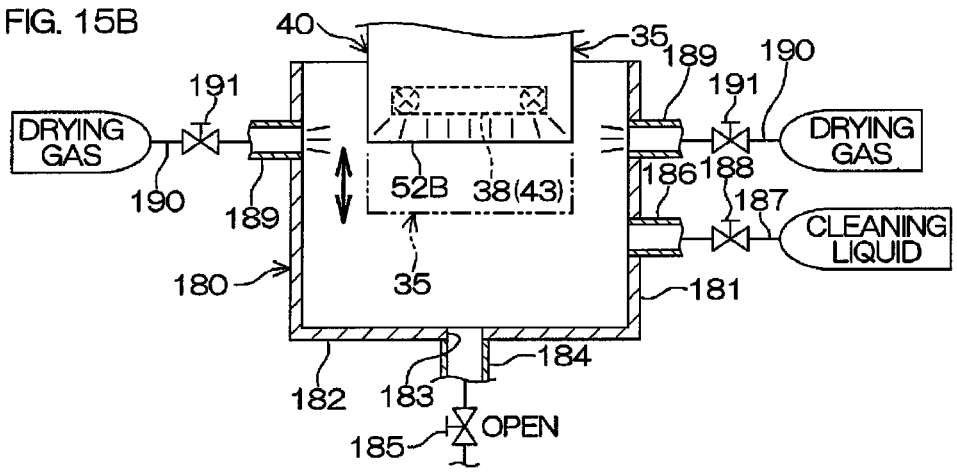
FIG. 15B is a schematic diagram showing a step subsequent to the step of FIG. 15A.
Figure 15C:
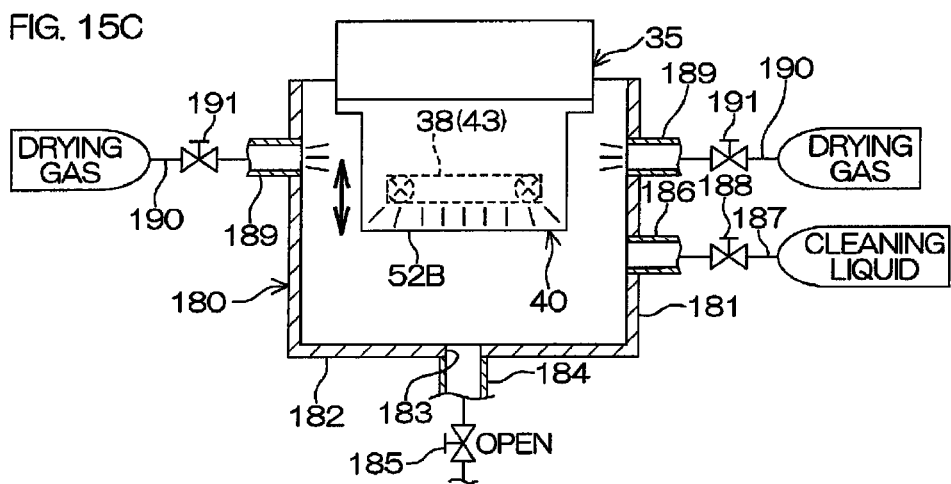
FIG. 15C is a schematic diagram showing a step subsequent to the step of FIG. 15B.

FIG. 14 is a flow chart showing an exemplary heater head cleaning/drying step. FIG. 15A is a schematic diagram for explaining the cleaning operation of the heater head cleaning/drying step, and FIGS. 15B and 15C are schematic diagrams for explaining the drying operation of the heater head cleaning/drying step.

At a predetermined cleaning time, the controller 55 closes the drain valve 185, and opens the cleaning liquid valve 188 (Step S31). When the cleaning liquid is spouted from the cleaning liquid nozzle 186 with the drain valve 185 being closed, the cleaning liquid flows to the bottom 182 of the cleaning pod 180 to be retained in the cleaning pod 180 as shown in FIG. 15A. The spouting of the cleaning liquid from the cleaning liquid nozzle 186 is continued until the liquid surface level of the cleaning liquid retained in the cleaning pod 180 reaches a predetermined cleaning height level. The cleaning height level is defined at a higher level than the lower surface 52B of the heater head 35 located at the home position. Therefore, a lower outer surface portion of the lamp housing 40 (the lower surface 52B and a lower outer peripheral surface portion of the peripheral wall of the lamp housing 40) is immersed in the cleaning liquid after the liquid surface of the cleaning liquid retained in the cleaning pod 180 reaches the cleaning height level.

If the liquid surface level of the cleaning liquid retained in the cleaning pod 180 reaches the cleaning height level (YES in Step S32), the controller 55 closes the cleaning liquid valve 188 (Step S33). Thus, the supply of the cleaning liquid from the cleaning liquid nozzle 186 is stopped. The liquid surface level of the cleaning liquid may be detected, for example, by a liquid surface sensor (not shown) and, based on a detection result outputted from the liquid surface sensor, the controller 55 may judge that the liquid surface level reaches the cleaning height level. Alternatively, a liquid retaining period required for the liquid surface level to reach the cleaning height level in the cleaning pod 180 from an empty state of the cleaning pod 180 may be preliminarily determined, and the cleaning liquid valve 188 may be closed after a lapse of the liquid retaining period from the opening of the cleaning liquid valve 188.

The SPM liquid mist and other foreign matter adhering to the lower surface 52B of the lamp housing 40 are washed away by immersing the lower surface 52B of the lamp housing 40 in the cleaning liquid. Thereafter, the cleaning liquid is kept retained in a present amount in the cleaning pod 180, whereby the lower outer surface portion of the lamp housing 40 is kept immersed in the cleaning liquid.

After a lapse of a predetermined cleaning period (immersion period) from the closing of the cleaning liquid valve 188 (YES in Step S34), the controller 55 opens the drain valve 185 (Step S35). With the drain valve 185 open, the cleaning liquid retained in the cleaning pod 180 is drained from the drain port 183 through the drainage line 184. Thus, the immersion of the lower outer surface portion of the lamp housing 40 in the cleaning liquid is completed.

Subsequently, the drying operation shown in FIGS. 15B and 15C is performed.

After the cleaning liquid is drained from the cleaning pod 180, the controller 55 opens the drying gas valves 191 (Step S36). Thus, the drying gas is generally horizontally spouted from the spouts of the drying gas nozzles 189 inward of the cleaning pod 180.

The controller 55 controls the lift drive mechanism 37 to move up the heater head 35, whereby the spouts of the drying gas nozzles 189 are opposed to the outer circumferential surface of the peripheral wall of the lamp housing 40.

Thereafter, the controller 55 controls the lift drive mechanism 37 to move up and down the heater head 35 between a predetermined upper position (indicated by a solid line in FIG. 15B) and a middle position (indicated by a two-dot-and-dash line in FIG. 15B and indicated by a solid line in FIG. 15C) (Step S37). At the upper position of the heater head 35, the lower surface 52B of the heater head 35 is located sideward of the spouts of the drying gas nozzles 189. Therefore, the upper position is higher than the home position. The middle position of the heater head 35 is defined between the upper position and the home position. At the middle position, a portion of the outer peripheral surface of the heater head 35 (the outer peripheral surface of the lamp housing 40) immersed in the cleaning liquid in the cleaning operation described above is located at a lower level than the drying gas nozzles 189.

As the heater head 35 is moved up and down, a drying gas spraying position (supply position) to which the drying gas is sprayed on the lower outer peripheral surface portion of the peripheral wall of the lamp housing 40 is also vertically moved (moved up and down). Therefore, the drying gas can be extensively sprayed over the outer peripheral surface of the peripheral wall of the lamp housing 40. Thus, the cleaning liquid adhering to the lower outer peripheral surface portion of the peripheral wall of the lamp housing 40 can be blown away to be removed.

When the heater head 35 is located at the upper position as shown in FIG. 15B, the drying gas spouted from the drying gas nozzles 189 flows along the lower surface 52B of the lamp housing 40 slightly below the lower surface 52B. The cleaning liquid adhering to the lower surface 52B is blown away to be removed by the drying gas thus flowing. The cleaning liquid blown from the heater head 35 is received by the peripheral wall 181. Therefore, droplets of the cleaning liquid are substantially prevented from scattering outside the cleaning pod 180.

In the vertical movement of the heater head 35, the controller 55 may control the lift drive mechanism 37 to move up the heater head 35 to the upper position and, before starting the downward movement of the heater head 35, once stop the vertical movement of the heater head 35 to keep the heater head 35 at the upper position for a predetermined period. In this case, the cleaning liquid can be more effectively removed from the lower surface 52B of the lamp housing 40.

Further, the controller 55 controls the amplifier 54 to emit the infrared radiation from the infrared lamp 38 (Step S38: Heat-drying step), while the drying gas is spouted from the drying gas nozzles 189 in Step S36. Thus, the lamp housing 40 is warmed, whereby the cleaning liquid adhering to the lower portion of the lamp housing 40 evaporates to be removed.

The spouting of the drying gas from the drying gas nozzles 189 and the emission of the infrared radiation from the infrared lamp 38 are continued for a predetermined drying period from the start of the emission of the infrared radiation from the infrared lamp 38.

After a lapse of the drying period (YES in Step S39), the controller 55 closes the drying gas valves 191 (Step S40) to stop spouting the drying gas from the drying gas nozzles 189. Further, the controller 55 controls the amplifier 54 to stop emitting the infrared radiation from the infrared lamp 38 (Step S40).

The controller 55 controls the lift drive mechanism 37 to move down the heater head 35 back to its home position (Step S41).

Thus, the heater head cleaning/drying step ends.

According to this embodiment, as described above, the cleaning operation is performed for cleaning the heater head 35 every time the resist removing process is performed on a wafer W. In the cleaning operation, the heater head 35 is located at its home position. With the drain valve 185 closed, the cleaning liquid is supplied from the cleaning liquid nozzle 186 to be thereby retained in the cleaning pod 180. The lower outer surface portion of the lamp housing 40 is immersed in the cleaning liquid retained in the cleaning pod 180, whereby the lower outer surface portion of the lamp housing 40 including the lower surface 52B can be cleaned.

A great amount of SPM liquid mist generated in the SPM liquid film heating step (Step S4 shown in FIG. 5) is liable to adhere to the lower surface 52B of the lamp housing 40. The SPM mist can be washed away with the cleaning liquid supplied to the lower surface 52B of the lamp housing 40. Thus, the lower surface 52B of the lamp housing 40 can be advantageously cleaned, so that the lower surface 52B of the lamp housing 40 can be kept clean. This prevents the reduction in the intensity of the infrared radiation outputted from the lamp housing 40, while preventing the lower surface 52B of the lamp housing from becoming a source of particles.

After the cleaning operation is performed on the heater head 35, the lower outer surface portion of the lamp housing 40 including the lower surface 52B is dried. This prevents the cleaning liquid from remaining on the lower outer surface portion of the lamp housing 40 to adversely influence the treatment of the wafer W.

Figure 16:
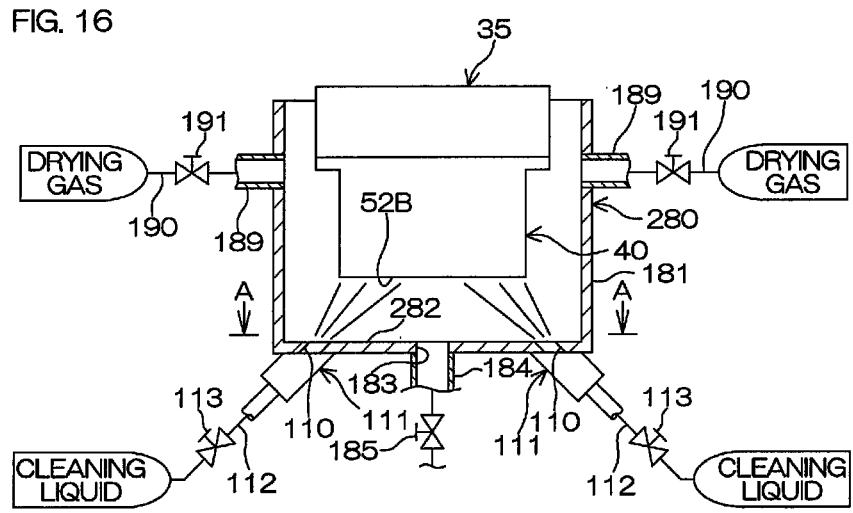
FIG. 16 is a diagram showing the structure of another exemplary cleaning pod.
Figure 17:
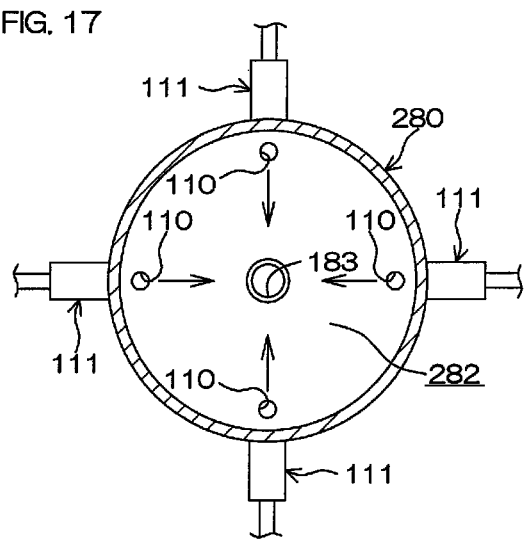
FIG. 17 is a sectional view taken along a sectional line A-A and viewed in an arrow direction in FIG. 16.

FIG. 16 is a diagram showing the structure of another exemplary cleaning pod (accommodating member). FIG. 17 is a sectional view taken along a sectional line A-A and viewed in an arrow direction in FIG. 16. The cleaning pod 280 shown in FIGS. 16 and 17 is provided instead of the cleaning pod 180 in the arrangement shown in FIG. 11.

In FIG. 16 and the like, components corresponding to those shown in FIG. 12 are designated by the same reference characters as in FIG. 12, and duplicate description will be omitted.

The cleaning pod 280 includes a plurality of cleaning liquid nozzles (e.g., four cleaning liquid nozzles) 111 provided in a disk-shaped bottom 282 thereof. The cleaning liquid nozzles 111 each have a cleaning liquid spout 110 through which the cleaning liquid is spouted toward the lower surface 52B of the heater head 35.

As shown in FIGS. 16 and 17, the cleaning liquid spouts 110 are disposed in a peripheral portion of the bottom 282 equidistantly circumferentially of the bottom 282. The spouting directions of the cleaning liquid spouts 110 each extend obliquely upward at a predetermined angle (e.g., 30 degrees to 60 degrees) with respect to the vertical direction toward the center axis of the cylindrical cleaning pod 180. The cleaning liquid is supplied to the cleaning liquid nozzles 111 through cleaning liquid supply lines 112. Cleaning liquid valves 113 are respectively provided in the cleaning liquid supply lines 112. With the cleaning liquid valves 113 open, the cleaning liquid is supplied to the corresponding cleaning liquid nozzles 111 and spouted from the cleaning liquid spouts 110 of the cleaning liquid nozzles 111.

In the cleaning pod 280, the cleaning operation is performed in a different manner from that in the cleaning pod 180 shown in FIG. 12 and the like. In the cleaning pod 280, on the other hand, the drying operation is performed in the same manner as in the cleaning pod 180 shown in FIG. 12 and the like. In the cleaning pod 280, the heater head 35 is subjected to the cleaning operation at a cleaning position (shown in FIG. 16) slightly above the home position.

At a predetermined cleaning time, the controller 55 controls the lift drive mechanism 37 to move up the heater head 35 to locate the heater head 35 at the cleaning position which is defined slightly above the home position and below the middle position (shown in FIG. 15C).

Further, the cleaning liquid valves 113 are opened to spout the cleaning liquid from the respective cleaning liquid spouts 110. The cleaning liquid spouted from the cleaning liquid spouts 110 is applied to the lower surface 52B of the heater head 35. In this embodiment, the cleaning liquid spouted from the cleaning liquid spouts 110 is applied to portions of the round lower surface 52B intermediate between the cleaning liquid spouts 110 and the center of the lower surface 52B. The cleaning liquid applied to the lower surface 52B spreads over the lower surface 52B around the lower surface 52B. After a lapse of a predetermined cleaning period from the start of the spouting of the cleaning liquid from the cleaning liquid nozzles 111, the cleaning liquid valves 113 are closed. The drain valve 185 is kept open throughout the cleaning operation. Therefore, the cleaning liquid flowing to the bottom 282 is not retained on the bottom 282, but drained out of the apparatus through the drainage line 184.

In the cleaning pod 280, the SPM liquid mist and other foreign matter adhering to the lower surface 52B of the lamp housing 40 are washed away with the cleaning liquid supplied to the lower surface 52B of the lamp housing 40. Thus, the lower surface 52B of the lamp housing 40 can be advantageously cleaned.

Thereafter, the drying operation is performed as described with reference to FIGS. 15B and 15C.

Figure 18:
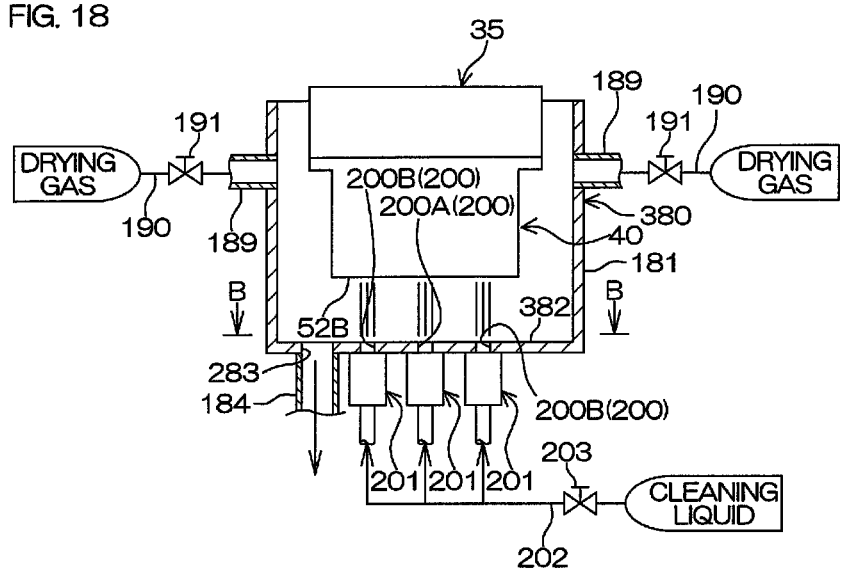
FIG. 18 is a diagram showing the structure of further another exemplary cleaning pod.
Figure 19:
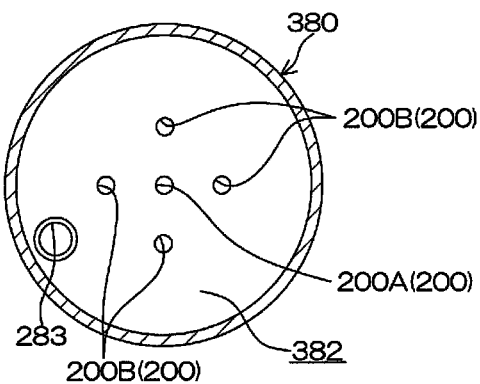
FIG. 19 is a sectional view taken along a sectional line B-B and viewed in an arrow direction in FIG. 18.

FIG. 18 is a diagram showing the structure of further another exemplary cleaning pod (accommodating member) 380. FIG. 19 is a sectional view taken along a sectional line B-B and viewed in an arrow direction in FIG. 18. The cleaning pod 380 shown in FIGS. 18 and 19 is employed instead of the cleaning pod 180 in the arrangement shown in FIG. 11.

In FIG. 18 and the like, components corresponding to those shown in FIG. 12 are designated by the same reference characters as in FIG. 12, and duplicate description will be omitted.

In this cleaning pod 380, a plurality of cleaning liquid nozzles 201 (e.g., five cleaning liquid nozzles, only three of which are illustrated in FIG. 18) are provided in a disk-shaped bottom 382 of the cleaning liquid pod 380. The cleaning liquid nozzles 201 each have a cleaning liquid spout 200 through which the cleaning liquid is spouted toward the lower surface 52B of the heater head 35. Since one of the cleaning liquid spouts 200 is disposed at the center of the bottom 382, a drain port 283 is provided in a peripheral portion of the bottom 382.

The cleaning liquid spouts 200 include a center spout 200A to be opposed from below to the center of the lower surface 52B of the heater head 35 located at the home position, and a plurality of peripheral spouts (e.g., four peripheral spouts) 200B to be opposed from below to a peripheral portion of the lower surface 52B of the heater head 35. The peripheral spouts 200B are disposed circumferentially equidistantly in the peripheral portion of the bottom 382. The spouting directions of the respective cleaning liquid spouts 200A, 200B are vertically upward. The cleaning liquid is supplied to the cleaning liquid nozzles 201 through a cleaning liquid supply line 202. A cleaning liquid valve 203 is provided in the cleaning liquid supply line 202. With the cleaning liquid valve 203 open, the cleaning liquid is supplied to the cleaning liquid nozzles 201 to be spouted from the cleaning liquid spouts 200 (200A, 200B) of the cleaning liquid nozzles 201.

In the cleaning pod 380, the cleaning operation is performed in a different manner from that in the cleaning pod 180 shown in FIG. 12 and the like. In the cleaning pod 380, on the other hand, the drying operation is performed in the same manner as in the cleaning pod 180 shown in FIG. 12 and the like. In the cleaning pod 380, the heater head 35 is subjected to the cleaning operation at a cleaning position (shown in FIG. 18) as in the cleaning pod 280 shown in FIG. 16 and the like.

After the heater head 35 is located at the cleaning position, the cleaning liquid valve 203 is opened to spout the cleaning liquid from the respective cleaning liquid spouts 200 (200A, 200B). The cleaning liquid spouted from the cleaning liquid spouts 200 is applied to the lower surface 52B of the heater head 35 to spread over the lower surface 52B around the lower surface 52B. After a lapse of a predetermined cleaning period from the start of the spouting of the cleaning liquid from the cleaning liquid nozzles 201, the cleaning liquid valve 203 is closed. The drain valve 185 is kept open throughout the cleaning operation. Therefore, the cleaning liquid flowing to the bottom 382 is not retained on the bottom 382, but drained through the drainage line 184 out of the apparatus.

In this manner, the SPM liquid mist and other foreign matter are washed away with the cleaning liquid supplied to the lower surface 52B of the lamp housing 40. Thus, the lower surface 52B of the lamp housing 40 can be advantageously cleaned.

Thereafter, the drying operation is performed as described above with reference to FIGS. 15B and 15C.

The embodiment described with reference to FIGS. 12 to 19 may be modified as mentioned in the followings.

The cleaning liquid is not necessarily required to be retained in the cleaning pod 280 of FIG. 16 and in the cleaning pod 380 of FIG. 17. Therefore, the drain valve 185 may be obviated in the cleaning pod 280, 380.

The number of the drying gas nozzles 189 is not limited to two, but three or more drying gas nozzles 189 may be provided. In this case, the drying gas nozzles 189 are desirably disposed at the same height level, and desirably disposed circumferentially equidistantly.

The spouting directions of the drying gas nozzles 189 may be obliquely downward rather than horizontal.

The drying gas nozzles 189 are not necessarily required to be provided in the peripheral wall 181 of the cleaning pod, but may be disposed above the top of the cleaning pod 180, 280, 380 (i.e., outside the cleaning pod).

In the embodiments described above, both the spray-drying operation for spraying the drying gas from the drying gas nozzles 189 and the heat-drying operation for warming the lamp housing 40 by the infrared lamp 38 are performed to dry the outer surface of the lamp housing 40 in the heater head drying operation by way of example. However, only the heat-drying operation with the use of the infrared lamp 38 may be performed to dry the outer surface of the lamp housing 40 without performing the spray-drying operation with the use of the drying gas.

Where the heater head cleaning/drying step is performed after the wafer W is unloaded from the treatment chamber 2, the heater arm 34 may be cleaned in the heater head cleaning/drying step. The cleaning of the heater arm 34 may be achieved, for example, by using a bar nozzle (not shown) separately provided in the treatment chamber 2. The bar nozzle includes a multiplicity of spouts horizontally arranged in a single row or in plural rows and each directed vertically downward, and is disposed in an upper region of the treatment chamber 2. In this case, the cleaning liquid is spouted from the respective spouts of the bar nozzle with the heater arm 34 being located below the bar nozzle in opposed relation to the bar nozzle. Thus, the cleaning liquid falls over the outer surface of the heater arm 34 to clean the outer surface of the heater arm 34.

Where the heater head cleaning/drying step is performed after the wafer W is unloaded from the treatment chamber 2, the interior of the treatment chamber 2 may be cleaned (chamber cleaning may be performed) in the heater head cleaning/drying step of Step S10.

The two embodiments described above with reference to FIGS. 1 to 19 may be modified as mentioned in the followings.

The DIW is used as the cleaning liquid for the cleaning operation by way of example. However, the cleaning liquid is not limited to the DIW, but a dilute hydrofluoric acid aqueous solution, carbonated water, hydrolytic ion water, ozone water or the like may be used as the cleaning liquid. Where a chemical liquid such as the dilute hydrofluoric acid aqueous solution is used as the cleaning liquid, a rinsing operation may be performed for rinsing away the cleaning liquid from the heater head 35 with the use of the DIW or the carbonated water after the cleaning liquid is supplied to the heater head 35.

The nitrogen gas is used as the drying gas by way of example, but clean air or other inert gas may be used as the drying gas.

The embodiments described above are applicable to a heater cleaning method for cleaning a heater provided in a substrate treatment apparatus adapted to selectively etch a nitride film formed on a major surface of a substrate with the use of a higher temperature etching liquid such as containing phosphoric acid.

While the present invention has been described in detail by way of the embodiments thereof, it should be understood that these embodiments are merely illustrative of the technical principles of the present invention but not limitative of the invention. The scope of the present invention is to be limited only by the appended claims.

This application corresponds to Japanese Patent Application Nos. 2012-68082 and 2012-68083 filed in the Japan Patent Office on Mar. 23, 2012, the disclosure of which is incorporated herein by reference in its entirety.

REFERENCE SIGNS LIST

1 SUBSTRATE TREATMENT APPARATUS
2 TREATMENT CHAMBER
2A PARTITION WALL
3 WAFER ROTATING MECHANISM
4 REMOVAL LIQUID NOZZLE
5 CUP
6 CHUCK ROTATIVE DRIVE MECHANISM
7 SPIN SHAFT
8 SPIN BASE
9 CLAMPING MEMBERS
11 FIRST LIQUID ARM
12 FIRST LIQUID ARM PIVOT MECHANISM
15 REMOVAL LIQUID SUPPLY LINE
23 REMOVAL LIQUID VALVE
24 DIW NOZZLE
25 SC1 NOZZLE
26 DIW SUPPLY LINE
27 DIW VALVE
28 SECOND LIQUID ARM
29 SECOND LIQUID ARM PIVOT MECHANISM
30 SC1 SUPPLY LINE

31 SC1 VALVE
33 SUPPORT SHAFT
34 HEATER ARM
35 HEATER HEAD
36 PIVOT DRIVE MECHANISM
37 LIFT DRIVE MECHANISM
38 INFRARED LAMP
39 OPENING
40 LAMP HOUSING
40A FLANGE
41 LID
42 SUPPORT MEMBER
42A UPPER SURFACE
42B LOWER SURFACE
43 ANNULAR PORTION
44, 45 STRAIGHT PORTIONS
46, 47 INSERTION HOLES
48 O-RINGS
49 LOWER SURFACE
50 UPPER BASE SURFACE
51 GROOVE
52 BOTTOM PLATE
52A UPPER SURFACE
52B LOWER SURFACE
54 AMPLIFIER
55 CONTROLLER
56 BOLTS
58, 59 INSERTION HOLES
60 GAS SUPPLY PASSAGE
61 EVACUATION PASSAGE
62 GAS SUPPLY PORT
63 EVACUATION PORT
64 GAS SUPPLY LINE
65 EVACUATION LINE
70 LIQUID FILM
80 BACK SIDE LIQUID SUPPLY PIPE
81 BACK SIDE GAS SUPPLY PIPE
82 BACK SIDE NOZZLE
84 BACK SIDE LIQUID SPOUT
85 BACK SIDE GAS SPOUT
86 LOWER CLEANING LIQUID SUPPLY LINE
87 LOWER CLEANING LIQUID VALVE
88 LOWER DRYING GAS SUPPLY LINE
89 LOWER DRYING GAS VALVE
90 UPPER CLEANING LIQUID SUPPLY LINE
91 UPPER CLEANING LIQUID VALVE
92 UPPER DRYING GAS SUPPLY LINE
93 UPPER DRYING GAS VALVE
94 UPPER CLEANING LIQUID NOZZLE
95 UPPER DRYING GAS NOZZLE
101 SUBSTRATE TREATMENT APPARATUS
110 CLEANING LIQUID SPOUTS
111 CLEANING LIQUID NOZZLES
112 CLEANING LIQUID SUPPLY LINES
113 CLEANING LIQUID VALVES
180, 280, 380 CLEANING PODS
181 PERIPHERAL WALL
182 BOTTOM
183 DRAIN PORT
184 DRAINAGE LINE
185 DRAIN VALVE
186 CLEANING LIQUID NOZZLE
187 CLEANING LIQUID SUPPLY LINE
188 CLEANING LIQUID VALVE
189 DRYING GAS NOZZLES
190 DRYING GAS SUPPLY LINES
191 DRYING GAS VALVES
200 CLEANING LIQUID SPOUTS
200A CENTER SPOUT
200B PERIPHERAL SPOUTS
201 CLEANING LIQUID NOZZLES
202 CLEANING LIQUID SUPPLY LINE
203 CLEANING LIQUID VALVE
282 BOTTOM
283 DRAIN PORT
382 BOTTOM
A SECTIONAL LINE
B SECTIONAL LINE
C ROTATION AXIS
S1 TO S10, S20 TO S29, S31 TO S41 STEPS
W WAFER

The invention claimed is:

1. A substrate treatment method executed by a substrate treatment apparatus, the substrate treatment apparatus including a substrate holder that holds a substrate in a horizontal posture, and a lower nozzle that spouts a cleaning liquid upwardly toward a lower surface of the substrate held by the substrate holder, the substrate treatment method comprising:
a step of holding a liquid film on an upper surface of the substrate held by the substrate holder;
a step of heating the liquid film concurrently with the liquid film holding step with a heater that has an infrared lamp that heats the liquid film, and a housing which has a bottom plate covering the infrared lamp from below and accommodates the infrared lamp, the liquid film heating step including a step of locating the heater at a liquid film heating position above the substrate held by the substrate holder in an opposed relation to the upper surface of the substrate;
a step of moving the heater, after the liquid film heating step, from above the substrate to a lateral side of the substrate holder;
a step of removing the substrate from the substrate holder after the liquid film holding step and the liquid film heating step;
a step of locating the heater at a heater cleaning position above the substrate holder after the substrate removing step; and
a step of supplying a cleaning liquid to the housing of the heater located at the heater cleaning position by spouting the cleaning liquid from the lower nozzle to the lower plate of the housing after the heater locating step.

2. The substrate treatment method according to claim 1, wherein the cleaning liquid supplying step includes a step of spouting the cleaning liquid downward from an upper nozzle disposed above the substrate holder to supply the cleaning liquid to an outer surface of the housing concurrently with spouting the cleaning liquid from the lower nozzle.

3. The substrate treatment method according to claim 1, further comprising a step of moving a liquid applying position to which the cleaning liquid spouted from the lower nozzle is applied on the bottom plate of the housing concurrently with the lower nozzle cleaning liquid spouting step.

4. The substrate treatment method according to claim 1, further comprising a step of drying the housing by removing the cleaning liquid from the outer surface of the housing after completion of the cleaning liquid supplying step.

5. The substrate treatment method according to claim 4, wherein the drying step includes a step of heating the housing by irradiating the housing with infrared radiation emitted from the infrared lamp to heat the outer surface of the housing so as to dry the outer surface.

6. The substrate treatment method according to claim 4, wherein the substrate treatment apparatus further includes
a second lower nozzle that spouts a drying gas upward,
wherein the drying step includes a step of spraying the drying gas upward from the second lower nozzle, whereby the drying gas is supplied to the outer surface of the housing of the heater located at the heater cleaning position.

7. The substrate treatment method according to claim 1, wherein the heater cleaning position is higher than the liquid film heating position.

8. The substrate treatment method according to claim 1, further comprising a step of horizontally moving the housing of the heater with respect to the lower nozzle concurrently with the lower nozzle cleaning liquid spouting step, thereby changing a liquid applying position to which the cleaning liquid spouted from the lower nozzle is applied on the bottom plate of the housing.

* * * * *